(12) United States Patent
Yamazaki et al.

(10) Patent No.: US 6,872,638 B2
(45) Date of Patent: Mar. 29, 2005

(54) METHOD OF MANUFACTURING A SEMICONDUCTOR DEVICE

(75) Inventors: Shunpei Yamazaki, Tokyo (JP); Toru Mitsuki, Kanagawa (JP); Tamae Takano, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/078,240

(22) Filed: Feb. 20, 2002

(65) Prior Publication Data

US 2002/0127827 A1 Sep. 12, 2002

(30) Foreign Application Priority Data

Feb. 23, 2001 (JP) ...................................... 2001-049468

(51) Int. Cl.[7] .......................... H01L 21/20; H01L 21/36
(52) U.S. Cl. ........................... 438/487; 438/96; 438/97; 438/308; 438/365; 438/368; 438/378; 438/482; 438/488; 257/52; 257/63; 257/65; 257/66
(58) Field of Search ...................... 438/487–88, 96–97, 438/365, 368–378, 308, 482; 257/52, 63–66

(56) References Cited

U.S. PATENT DOCUMENTS

| | | | | |
|---|---|---|---|---|
| 4,256,681 A | * | 3/1981 | Lindmayer ................... | 264/85 |
| 4,814,292 A | * | 3/1989 | Sasaki et al. ................ | 437/101 |
| 5,529,937 A | | 6/1996 | Zhang et al. | |

(Continued)

FOREIGN PATENT DOCUMENTS

| | | |
|---|---|---|
| EP | 0 651 431 | 5/1995 |
| JP | 06-163409 | 6/1994 |
| JP | 07-183540 | 7/1995 |
| JP | 11-074536 A | 3/1999 |
| JP | 2002-150890 | 5/2000 |
| JP | 2002-076349 | 3/2002 |
| JP | 2002-305148 | 10/2002 |

OTHER PUBLICATIONS

Kimura et atl., "Device Simulation of Interface Roughness in Laser–Crystallized p–Si TFT's", pp. 263–266, 1999, AM–LCD.

(Continued)

*Primary Examiner*—Matthew Smith
*Assistant Examiner*—Granvill D. Lee, Jr.
(74) *Attorney, Agent, or Firm*—Nixon Peabody LLP; Jeffrey L. Costellia

(57) ABSTRACT

A method of performing irradiation of laser light is given as a method of crystallizing a semiconductor film. However, if laser light is irradiated to a semiconductor film, the semiconductor film is instantaneously melted and expands locally. The temperature gradient between a substrate and the semiconductor film is precipitous, distortions may develop in the semiconductor film. Thus, the film quality of the crystalline semiconductor film obtained will drop in some cases. With the present invention, distortions of the semiconductor film are reduced by heating the semiconductor film using a heat treatment process after performing crystallization of the semiconductor film using laser light. Compared to the localized heating due to the irradiation of laser light, the heat treatment process is performed over the entire substrate and semiconductor film. Therefore, it is possible to reduce distortions formed in the semiconductor film and to increase the physical properties of the semiconductor film.

35 Claims, 20 Drawing Sheets

U.S. PATENT DOCUMENTS

| | | | |
|---|---|---|---|
| 5,569,610 A | | 10/1996 | Zhang et al. |
| 5,639,698 A | | 6/1997 | Yamazaki et al. |
| 5,643,826 A | | 7/1997 | Ohtani et al. |
| 5,663,077 A | | 9/1997 | Adachi et al. |
| 5,773,327 A | | 6/1998 | Yamazaki et al. |
| 5,824,573 A | | 10/1998 | Zhang et al. |
| 5,854,096 A | | 12/1998 | Ohtani et al. |
| 5,879,977 A | | 3/1999 | Zhang et al. |
| 5,904,770 A | | 5/1999 | Ohtani et al. |
| 5,923,962 A | | 7/1999 | Ohtani et al. |
| 5,923,997 A | | 7/1999 | Mitanaga et al. |
| 5,948,496 A | * | 9/1999 | Kinoshita et al. .......... 428/64.1 |
| 5,953,597 A | | 9/1999 | Kusumoto et al. |
| 6,014,944 A | * | 1/2000 | Aklufi et al. ............... 118/723 |
| 6,066,516 A | | 5/2000 | Miyasaka |
| 6,184,068 B1 | | 2/2001 | Ohtani et al. |
| 6,281,057 B2 | | 8/2001 | Aya et al. |
| 6,285,042 B1 | | 9/2001 | Ohtani et al. |
| 6,319,761 B1 | | 11/2001 | Zhang et al. |
| 6,326,248 B1 | | 12/2001 | Ohtani et al. |
| 6,335,541 B1 | | 1/2002 | Ohtani et al. |
| 6,455,360 B1 | | 9/2002 | Miyasaka |
| 6,509,579 B2 | * | 1/2003 | Takeya et al. ................ 257/22 |
| 2001/0003659 A1 | | 6/2001 | Aya et al. |
| 2002/0119585 A1 | | 8/2002 | Yamazaki et al. |
| 2002/0146868 A1 | | 10/2002 | Miyasaka |
| 2003/0089909 A1 | | 5/2003 | Miyairi et al. |

OTHER PUBLICATIONS

Abe et al., "High–Performance Poly–Crystalline Silicon TFTs Fabricated Using the SPC and ELA Methods", pp. 85–88, Jul. 9–10, 1998, AM–LCD.

Specifications and Drawings for Application Serial No. 10/081,767, "Method of Manufacturing a Semiconductor Device" Filing Date: Feb. 25, 2002, Inventors: Shunpei Yamazaki et al.

Specifications and Drawings for Application Serial No. 10/056,054, "Method for Manufacturing a Semiconductor Device".

Australian Patent Office Search Report; Application No. SG 200200835–7; Filed Feb. 18, 2002; (Apr. 20,2004).

* cited by examiner

Fig. 1A formation of base insulating film/
formation of semiconductor film
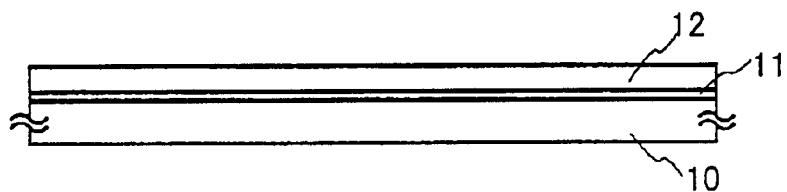
Fig. 1B laser anneal
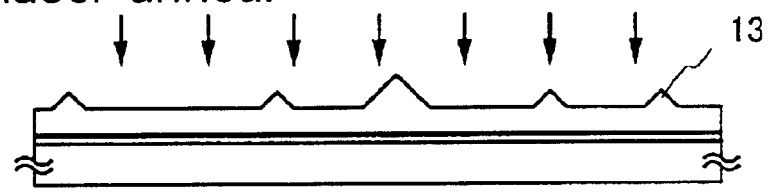
Fig. 1C heat treatment process
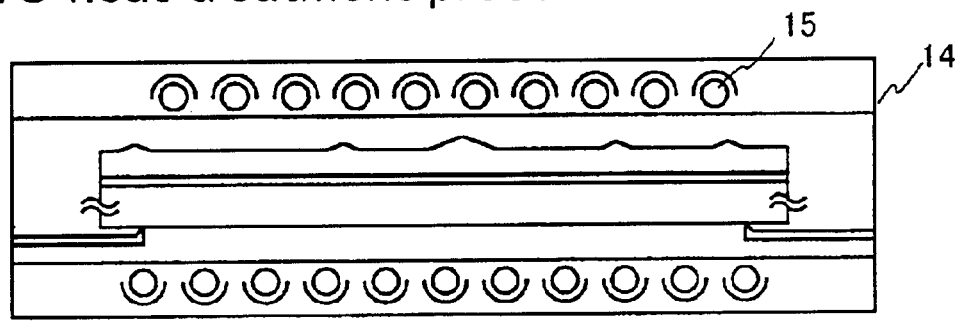
Fig. 1D formation of semiconductor film
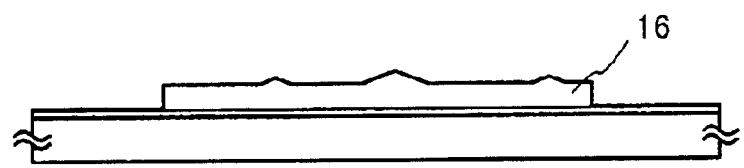

Fig. 2A formation of base insulating film/ formation of semiconductor film
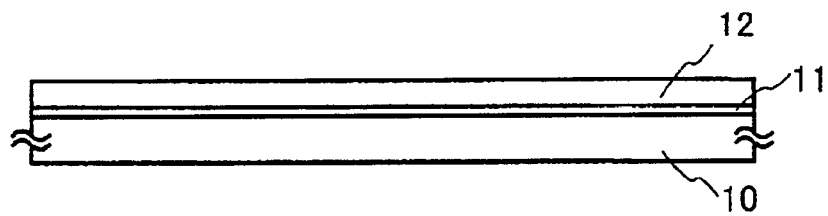
Fig. 2B laser anneal
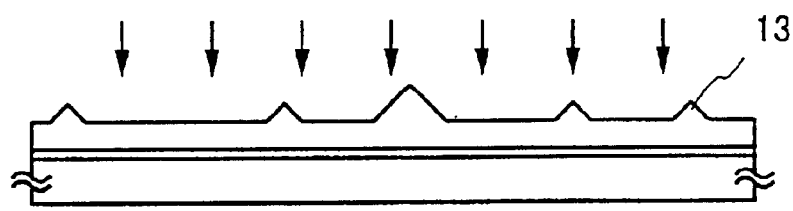
Fig. 2C formation of semiconductor film
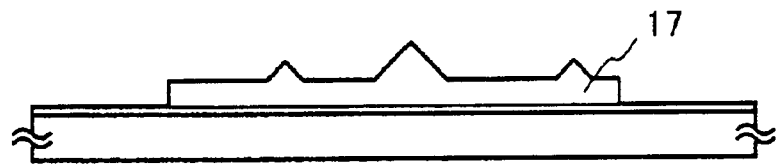
Fig. 2D heat treatment process
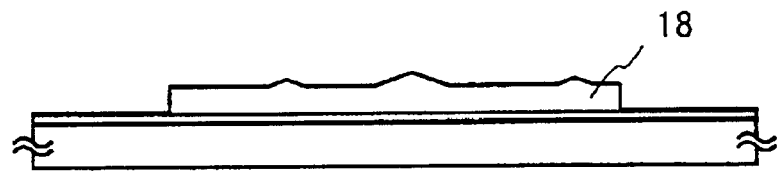

Fig. 3A formation of base insulating film/
formation of semiconductor film
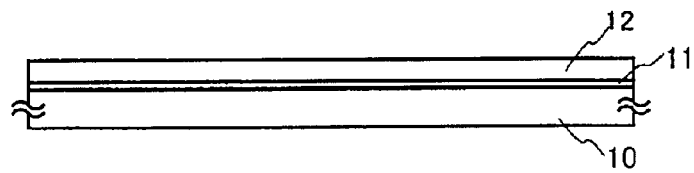
Fig. 3B irradiation of strong light
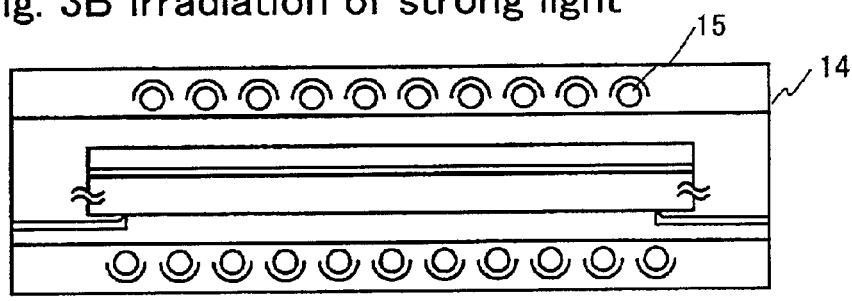
Fig. 3C laser anneal
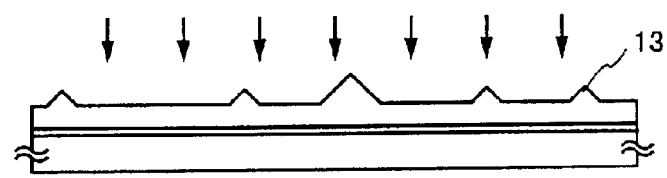
Fig. 3D heat treatment process
Fig. 3E formation of semiconductor film
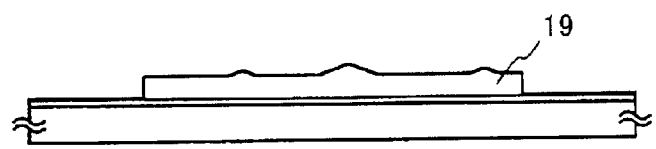

Fig. 4A formation of conductive film/formation of insulating film /formation of semiconductor film
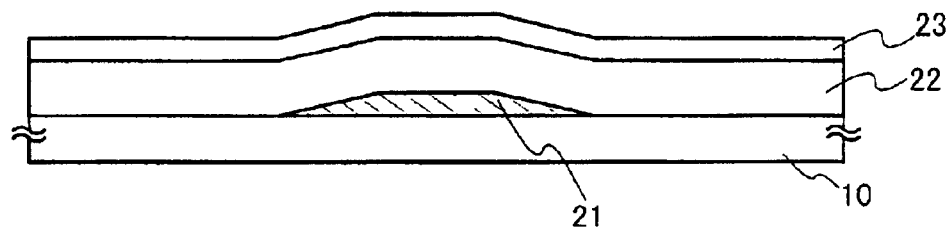
Fig. 4B laser anneal
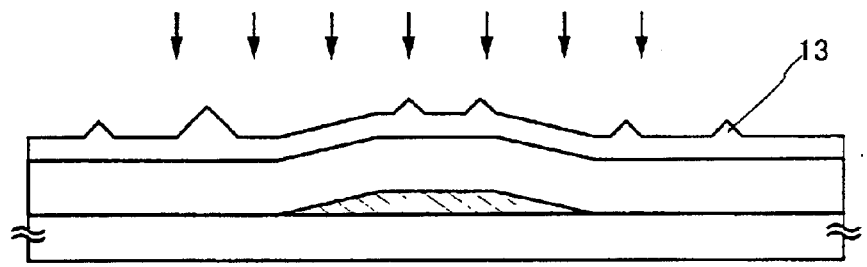
Fig. 4C heat treatment process
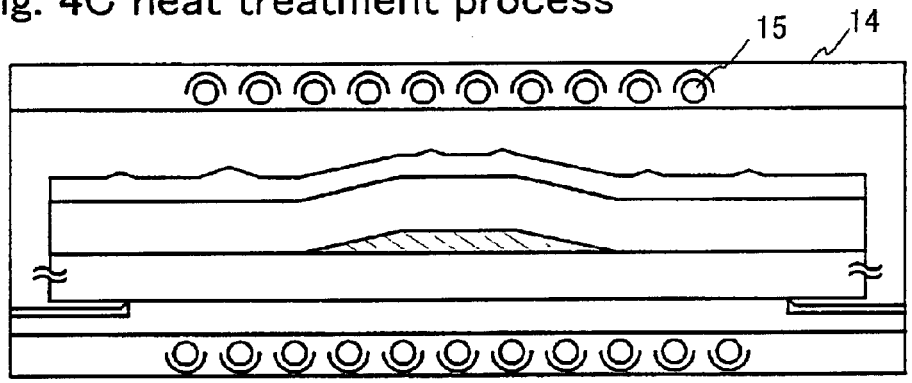
Fig. 4D formation of semiconductor film
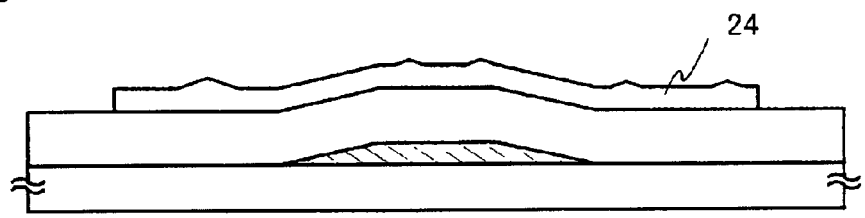

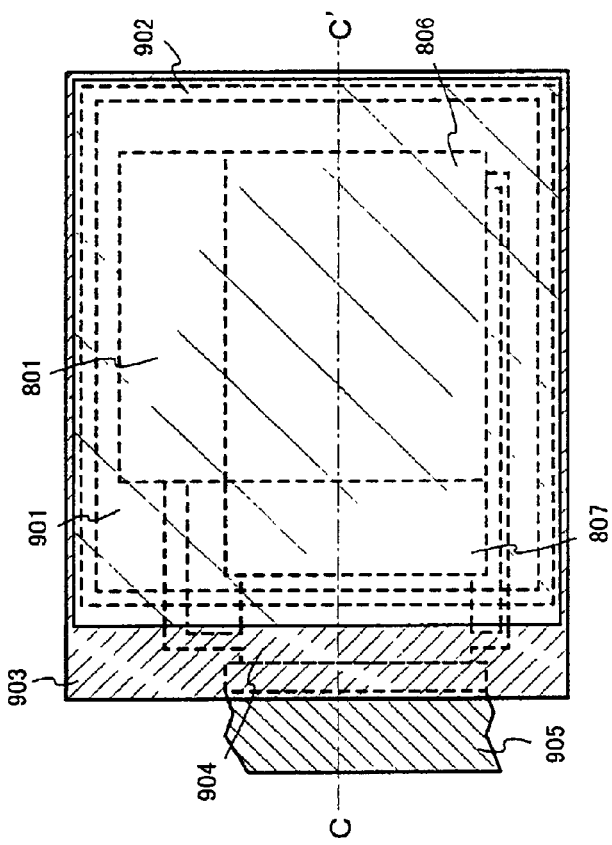
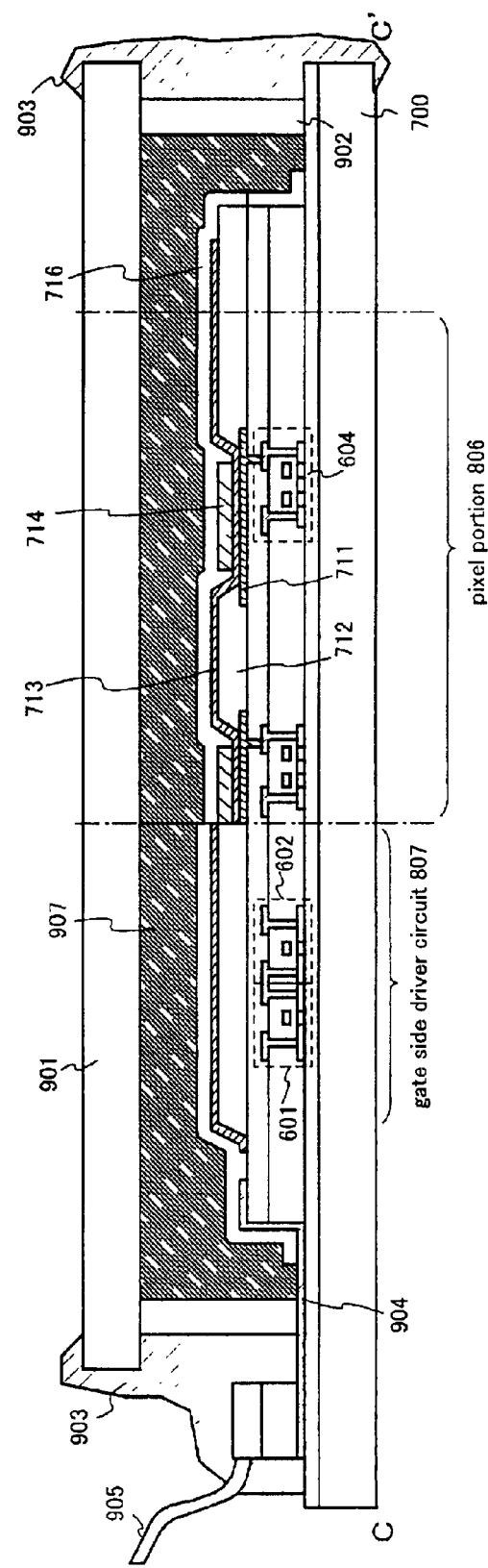
Fig. 14A
Fig. 14B

100 # METHOD OF MANUFACTURING A SEMICONDUCTOR DEVICE

BACKGROUND OF THE INVENTION

1. Field of the Invention

The present invention relates to a method of annealing a semiconductor film by using a laser beam (hereinafter referred to as laser annealing). The invention also relates to a method of manufacturing a semiconductor which includes the laser annealing method as one step. Incidentally, the term "semiconductor device" used herein generally includes an electro-optical devices such as liquid crystal display devices and light emitting devices as well as electronic equipment including the electro-optical devices as constituent parts.

2. Background Art

In recent years, a wide range of researches have been made as to the art of applying laser annealing to a semiconductor film formed on an insulating substrate such as a glass substrate to crystallize the semiconductor film or to improve the crystallinity thereof. Silicon is widely used for such a semiconductor film. In the present specification, means for crystallizing a semiconductor film by a laser beam to obtain a crystalline semiconductor film is referred to as laser crystallization. In addition, the crystalline semiconductor film indicates a semiconductor film in which a crystalline region is existed in the present specification.

As compared with synthetic quartz glass substrates which have heretofore widely been used, glass substrates have the advantages of being inexpensive and rich in workability and of facilitating fabrication of large-area substrates. This is the reason why a wide range of researches have been made. The reason why lasers are preferentially used for crystallization of glass substrates is that the melting points of glass substrates are low. Lasers can give high energy to semiconductor films without increasing the temperatures of substrates to a great extent. In addition, lasers are remarkably high in throughput compared to heating means using electric heating furnaces.

Since a crystalline semiconductor film formed by the application of laser annealing has high mobility, the crystalline silicon film is used to form thin film transistors (TFTs). The thin film transistors are widely used in a monolithic type of liquid crystal electro-optical device in which TFTs for pixel driving and TFTs for driver circuits are fabricated on one glass substrate.

A method of effecting laser annealing by forming a high power pulsed laser beam such as an excimer laser beam, by an optical system, into a laser beam which becomes a spot of several cm square or a linear shape of length 10 cm or more at an irradiation plane, and scanning the laser beam (or relatively moving a position irradiated with the laser beam with respect to an irradiation plane) has preferentially been used because the method is high in productivity and superior in industrial terms.

Particularly when a linear laser beam is used, high productivity can be realized because the entire irradiation plane can be irradiated with the linear laser beam by scanning in only directions perpendicular to the lengthwise direction of the linear laser beam, unlike the case where a spot-shaped laser beam is used which needs to be scanned in forward, rearward, rightward and leftward directions. The reason why the linear laser beam is scanned in the direction perpendicular to the lengthwise thereof direction is that the lengthwise direction is the most efficient scanning. Because of this high productivity, in the laser annealing method, the use of a linear laser beam into which a pulse oscillation excimer laser beam is formed by an appropriate optical system is presently becoming one of leading manufacturing techniques for a liquid crystal display devices using TFTs.

However, there are cases in which the film quality of a crystalline semiconductor film, obtained by a crystallization method employing laser light, falls. That is, if laser light is irradiated to a semiconductor film, then the semiconductor film instantaneously melts and locally expands, and distortion develops in the crystalline semiconductor film in order to relieve internal stresses that develop due to the expansion.

Further, a high energy can be imparted to the semiconductor film without much of a rise in the temperature of a substrate when using a crystallization method employing irradiation of laser light. A steep temperature gradient therefore develops between the substrate and the semiconductor film, and the semiconductor film distorts due to tensile stresses.

If distortion exists in the semiconductor film in an insulating gate semiconductor device, then potential barriers and trap levels are formed due to the distortion, and therefore the interface level between an active layer and a gate insulating film becomes high. Furthermore, an electric field is not applied uniformly if distortion exists, and this becomes a cause of operation failures of the semiconductor device. In addition, distortion of the surface of the semiconductor film damages the levelness of the gate insulating film, deposited by sputtering or CVD, and causes reliability to drop due to occurrences of insulating defects and the like. One important factor in determining electric field effect mobility of a TFT is a surface scattering effect. The degree of levelness of the interface between the active layer and the gate insulating film of the TFT exerts a large influence on the electric field effect mobility. High electric field effect mobility is obtained, without influence caused by scattering, the more level the interface becomes. Distortion of crystalline semiconductor films thus influences all of the TFT properties, and even a yield changes.

SUMMARY OF THE INVENTION

An object of the present invention is to form a semiconductor film having little distortion and to provide a method of manufacturing a semiconductor device using the semiconductor film.

The present invention is characterized in that distortion formed in a semiconductor film is reduced by heating the semiconductor film using a heat treatment process after performing crystallization of the semiconductor film using laser light. In contrast to localized heating that occurs with the irradiation of laser light, a substrate and the semiconductor film are heated overall with the heat treatment process, and therefore it becomes possible to relieve distortion formed in the semiconductor film and to enhance the physical properties of the semiconductor film.

A method of manufacturing a semiconductor device according to the present invention is characterized by comprising the steps of: irradiating laser light to an amorphous semiconductor film, forming a crystalline semiconductor film; and performing a heat treatment process, reducing distortion formed in the crystalline semiconductor film due to the irradiation of the laser light.

Pulse oscillation or light emission lasers such as gas lasers, solid state lasers, and metal lasers can be used as lasers for oscillating laser light in the aforementioned manufacturing method. Continuous oscillation or pulse oscillation lasers such as YAG lasers, $YVO_4$ lasers, YLF lasers, $YAlO_3$ lasers, glass lasers, ruby lasers, alexandrite lasers, and Ti:sapphire lasers exist as the solid state lasers. The gas lasers include continuous oscillation or pulse oscillation excimer lasers, Ar lasers, Kr lasers, and $CO_2$, lasers, while helium cadmium lasers, copper vapor lasers, and gold vapor lasers can be given as examples of the metal lasers. Further, the laser light may be converted into a higher harmonic wave.

Further, it is characterized in that the heat treatment process in the aforementioned method of manufacturing may be a thermal annealing method using an annealing furnace, and may be an RTA method.

A heat treatment process is performed for a short time by heating the substrate rapidly using a lamp in the RTA method. Light emitted from the lamp is referred to as "lamp light" within this specification. The lamp light is irradiated from the upper side of the substrate, from the lower side of the substrate, or from both the upper side and the lower side of the substrate. The lamp light is light emitted from a halogen lamp, a metal halide lamp, a xenon arc lamp, a carbon arc lamp, a high pressure sodium lamp, or a high pressure mercury lamp.

Further, in the above manufacturing method, it is characterized in that the heating temperature of the heat treatment process is equal to or greater than 500° C.

Further, in the above manufacturing method, it is characterized in that the amount of heating time for the heat treatment process is within 30 minutes.

Further, another method of manufacturing a semiconductor device according to the present invention is characterized by comprising the steps of: performing a first heat treatment process on the amorphous semiconductor film, forming a first crystalline semiconductor film; irradiating laser light to the first crystalline semiconductor film, forming a second crystalline semiconductor film; and performing a second heat treatment process, reducing distortion formed in the second crystalline semiconductor film due to the irradiation of the laser light.

It is characterized in that the first heat treatment process and the second heat treatment process in the above manufacturing method are performed by thermal annealing using an annealing furnace, or by irradiation of lamp light.

The lamp light is irradiated from the upper side of the substrate, from the lower side of the substrate, or from both the upper side and the lower side of the substrate. Light emitted from a halogen lamp, a metal halide lamp, a xenon arc lamp, a carbon arc lamp, a high pressure sodium lamp, or a high pressure mercury lamp is used. Further, substrates such as glass substrates, quartz substrates, plastic substrates, flexible substrates, silicon substrates, metallic substrates, and stainless steel substrates having an insulating film formed on their surfaces can be used as the substrate. Substrates made from glass such as barium borosilicate glass and alumino borosilicate glass can be used as the glass substrates. Further, the flexible substrates are film-shaped substrates and are made from materials such as PET, PES, PEN, or acrylic, and semiconductor devices can be made lighter in weight by being manufactured using the flexible substrates. Durability of the flexible substrate can be increased by forming a single layer or multiple layers of barrier layers such as aluminum films (AlON, AlN, AlO, and the like), carbon films (DLC (diamond like carbon) and the like) and SiN on one surface of the substrate, or on both surfaces. It is therefore preferable to form such a film.

Furthermore, pulse oscillation or continuous light emission lasers such as gas lasers, solid state lasers, and metal lasers can be used as the laser for oscillating the laser light in the aforementioned manufacturing method. The laser light may also be converted into a higher harmonic wave.

Further, in the above manufacturing method, it is characterized in that the heating temperature of the second heat treatment process is equal to or greater than 500° C.

Further, in the above manufacturing method, it is characterized in that the amount of heating time for the second heat treatment process is within 30 minutes.

As described above, the present invention has a simple constitution applicable to conventional TFT manufacturing processes, and therefore it is not necessary to prepare any new type of apparatus, and costs thus are not increased. Physical properties of a semiconductor film are raised, and the semiconductor surface is made level with the present invention. The film properties of gate insulating films formed on the semiconductor films are therefore sufficient, and the levelness of the gate insulating film can be maintained. Locally concentrated electric fields and surface scattering can consequently be prevented, and it becomes possible to form TFTs having a high mobility. The operating characteristics and the reliability of semiconductor devices can be raised by manufacturing the semiconductor devices using this type of TFT.

BRIEF DESCRIPTION OF THE DRAWINGS

In the accompanying drawings:

FIGS. 1A to 1D are diagrams showing an example of a concept of the present invention;

FIGS. 2A to 2D are diagrams showing an example of a concept of the present invention;

FIGS. 3A to 3E are diagrams showing an example of a concept of the present invention;

FIGS. 4A to 4D are diagrams showing an example of a concept of the present invention;

FIG. 14A is an upper surface diagram of a light emitting device;

FIG. 14B is a cross sectional structure diagram of a driver circuit and a pixel portion of the light emitting device;

Figure 5A:
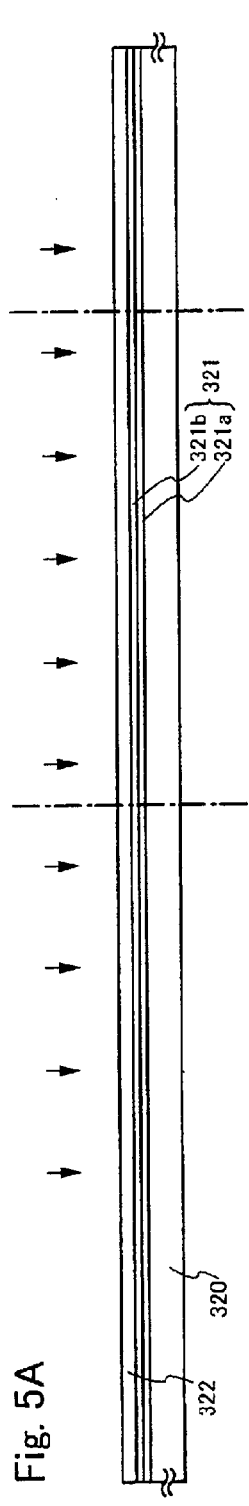
FIGS. 5A to 5D are cross sectional diagrams showing an example of a process of manufacturing a pixel TFT and driver circuit TFTs.
Figure 5B:
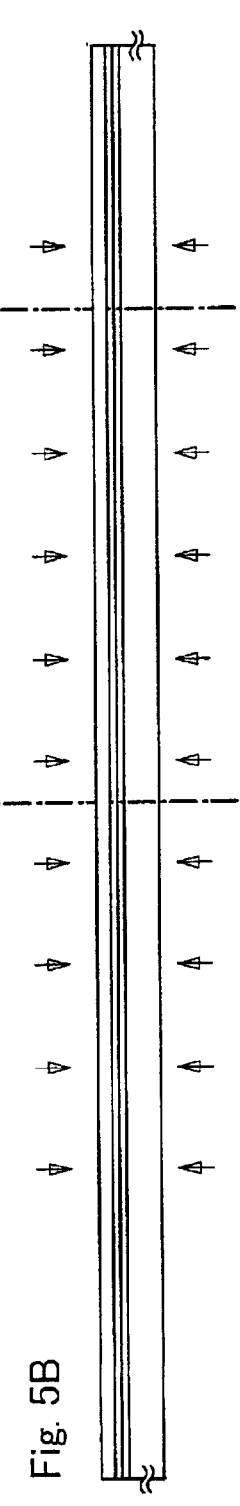

DETAILED DESCRIPTION OF THE PREFERRED EMBODIMENTS Embodiment mode

An embodiment mode of the present invention is explained using FIGS. 1A to 1D.

First, a base insulating film 11 is formed on a substrate 10. Substrates having light transmitting properties such as glass substrates, quartz substrates, plastic substrates, and flexible substrates are used as the substrate 10. Further, an insulating film formed from a silicon oxide film, a silicon nitride film, a silicon oxynitride film, or the like is used as the base insulating film. An example is shown here of using a single layer structure as the base insulating film, but the insulating film may also have a structure in which two or more layers are laminated. Note that the base insulating film may not be formed.

A semiconductor film 12 is formed next on the base insulating film 11. As the semiconductor film 12, a semiconductor film having an amorphous structure is formed using a known means (such as sputtering, LPCVD, or plasma CVD). The semiconductor film 12 is formed with a thickness of from 25 to 80 nm (preferably between 30 and 60 nm). There are no limitations placed on the semiconductor film material, but it is preferable to form it by using silicon, a silicon germanium (SiGe) alloy, and the like.

A laser crystallization method is then performed to form a crystalline semiconductor film. The laser crystallization method may of course also be used after performing another known crystallization process (such as a thermal crystallization method). Distortions 13 are formed in the crystalline semiconductor film due to the laser crystallization process. Note that it is preferable to release hydrogen contained in the semiconductor film before performing laser crystallization. Roughness in the film surface can be prevented if crystallization is performed after first reducing the amount of hydrogen contained in the film to be 5% or less of the total number of atoms present by performing heat treatment at 400 to 500° C. for about one hour. In general, the concentration of hydrogen contained in an amorphous semiconductor film formed by sputtering or LPCVD is lower than that contained in an amorphous semiconductor film formed by plasma CVD. Furthermore, even an amorphous semiconductor film formed by plasma CVD has a low hydrogen concentration, if it is formed at a temperature equal to or greater than 400° C. In addition, it is preferable to perform a heat treatment process at a temperature equal to or greater than 600° C. if thermal crystallization is performed.

Pulse oscillation or continuous light emission lasers such as gas lasers, solid state lasers, and metal lasers can be used in the laser crystallization method. Lasers such as continuous oscillation or pulse oscillation YAG lasers, $YVO_4$ lasers, YLF lasers, $YAlO_3$ lasers, glass lasers, ruby lasers, alexandrite lasers, and Ti:sapphire lasers exist as the solid state lasers. The gas lasers include continuous light emission or pulse oscillation excimer lasers, Ar lasers, Kr lasers, and $CO_2$ lasers, while helium cadmium lasers, copper vapor lasers, and gold vapor lasers can be given as examples of the metal lasers. A method in which a laser beam emitted from a laser oscillator is concentrated into a linear shape by an optical system and then irradiated to the semiconductor film may be used for cases in which the above lasers are used. The crystallization conditions may be suitably selected by an operator, but the pulse oscillation frequency is set to 300 Hz, and the laser energy density is set between 100 and 800 $mJ/cm^2$ (typically from 200 to 700 $mJ/cm^2$) when an excimer laser is used. Further, the second higher harmonic wave is used if a YAG laser is employed, the pulse oscillation frequency may be set from 1 to 300 Hz, and the laser energy density may be set between 300 and 1000 $mJ/cm^2$ (typically from 350 to 800 $mJ/cm^2$). The laser beam concentrated into a linear shape having a width of 100 to 1000 $\mu$m, for example 400 $\mu$m, is then irradiated over the entire surface of the substrate. Irradiation may be performed at this point with an overlap ratio for the linear shape beam set between 50 and 98%. Further, if a continuous oscillation laser is used, then it is necessary to set the energy density between 0.01 and 100 $MW/cm^2$ (preferably from 0.1 to 10 $MW/cm^2$). A stage is then moved relative to the laser light at a speed on the order of 0.5 to 2000 cm/s, and a crystalline semiconductor film is formed.

Further, laser crystallization methods can be performed in the atmosphere, in an inert gas atmosphere such as nitrogen, and in a reduced pressure atmosphere.

A heat treatment process is then performed by thermal annealing using an annealing furnace, or by RTA. Thermal annealing using an annealing furnace may be performed at a temperature equal to or greater than 500° C., preferably within a range from 550 to 575° C., for between 1 and 30 minutes. RTA may be performed, for example, by turning on eleven halogen lamps (infrared light) 15 set below the substrate, and ten of the halogen lamps 15 set above the substrate, in a nitrogen atmosphere. The temperature can be made to increase instantaneously with the RTA method, but the rate of temperature increase and the rate of temperature decrease may also be set from 30 to 300° C./min. Heat supplied from the halogen lamps is between 700 and 1300° C. (measured by a thermocouple embedded in a silicon wafer), and optimal heat treatment processing conditions differ in accordance with factors such as the states of the substrate and the semiconductor film used. The operator may therefore suitably determine the temperature.

Note that although a nitrogen atmosphere is used in this embodiment mode, the inert gasses such as helium (He), neon (Ne), and argon (Ar) may also be used. Further, in addition to the halogen lamps used here, an ultraviolet light lamp such as a xenon lamp may also be used as the light source.

Distortions of the semiconductor film are reduced after undergoing the heat treatment process as compared to the level present after the laser crystallization. Patterning is then performed to form a semiconductor film 16 in a predetermined shape. Electrical properties of a TFT can be made better provided that the semiconductor film is used in its manufacture.

The present invention having the above stated structure is explained in more detail now using the embodiments shown below.

[Embodiment 1]

An embodiment of the present invention is explained using FIGS. 1A to 1D.

First, a base insulating film 11 is formed on a substrate 10. Substrates such as glass substrates and quartz substrates having light transmitting properties are used as the substrate 10. Further, an insulating film formed from a silicon oxide film, a silicon nitride film, a silicon oxynitride film, or the like is used as the base insulating film 11. An example is shown here of using a single layer structure as the base insulating film 11, but the insulating film may also have a structure in which two or more layers are laminated. Note that the base insulating film may not be formed. A glass substrate is used in this embodiment, and a silicon oxynitride film is formed to a film thickness of 150 nm on the glass substrate by using plasma CVD.

A semiconductor film 12 is formed next on the base insulating film 11. The semiconductor film 12 is formed using a known means (such as sputtering, LPCVD, or plasma CVD) from a semiconductor film having an amorphous structure. The semiconductor film 12 is formed with a thickness from 25 to 80 nm (preferably between 30 and 60 nm). There are no limitations placed on the semiconductor film material, but it is preferable to form it by using silicon, a silicon germanium (SiGe) alloy, and the like. An amorphous silicon film having a film thickness of 55 nm is formed by plasma CVD in this embodiment.

A laser crystallization method is then performed to form a crystalline semiconductor film. Laser crystallization method may of course also be performed after using another known crystallization process (such as a thermal crystallization method). An excimer laser is irradiated in this embodiment such that its light is formed into a linear shape on an irradiation surface by using an optical system. The crystallinity of the semiconductor film is thus increased, but a distortions 13 develop in the semiconductor film due to the laser light irradiation.

A heat treatment process is then performed by thermal annealing using an annealing furnace, or by RTA. The heat treatment process may be performed, for example, by turning on the eleven halogen lamps (infrared light) 15 set below the substrate, and the ten halogen lamps 15 set above the substrate, in a nitrogen atmosphere. Heat supplied from the halogen lamps is between 700 and 1300° C. (measured by a thermocouple embedded in a silicon wafer), and optimal heat treatment processing conditions differ in accordance with factors such as the states of the substrate and the semiconductor film used. The operator may therefore suitably determine the temperature. The RTA method is applied in this embodiment, and the heat treatment process is performed for four minutes at a temperature of 700° C. in a nitrogen atmosphere.

The distortions in the semiconductor film are reduced after undergoing the heat treatment process as compared to the level present after the laser crystallization. Patterning is then performed to form a semiconductor film 16 in a desired shape. Electrical properties of a TFT can be made better provided that the semiconductor film is used in the manufacture of the TFT.

[Embodiment 2]

A method of reducing distortions of a semiconductor film that has undergone a manufacturing process differing from that of Embodiment 1 is explained in this embodiment using FIGS. 2A to 2D.

First, the state of FIG. 1A is manufactured in accordance with this Embodiment 1. Note that FIG. 1A and FIG. 2A show the same state, and that the same reference numerals are used in corresponding locations.

Laser crystallization is performed next to form a crystalline semiconductor film. Laser crystallization method may of course also be performed after using another known crystallization process (such as a thermal crystallization method). The second higher harmonic wave of a YAG laser is irradiated in this embodiment such that its light is formed into a linear shape on an irradiation surface by using an optical system. The crystallinity of the semiconductor film is thus increased, but the distortions 13 develop in the semiconductor film due to the laser light irradiation.

Patterning is performed next to form a semiconductor film 17.

A heat treatment process is then performed by thermal annealing using an annealing furnace or by RTA. It is preferable that the heat treatment process be performed at a temperature equal to or greater than 500° C. A thermal annealing method using an annealing furnace is applied in this embodiment, and the heat treatment process is performed for 30 minutes at 550° C. in a nitrogen atmosphere.

The distortions in the semiconductor film are reduced after undergoing the heat treatment process as compared to the level present after the laser crystallization. The electrical properties of a TFT can be made better provided that the semiconductor film is used in the manufacture of the TFT.

[Embodiment 3]

A method of reducing distortions of a semiconductor film that has undergone a manufacturing process differing from those of Embodiments 1 and 2 is explained in this embodiment using FIGS. 3A to 3E.

First, the state of FIG. 1A is manufactured in accordance with Embodiment 1. Note that FIG. 1A and FIG. 3A show the same state, and that the same reference numerals are used in corresponding locations.

A first heat treatment process is performed next, to crystallize the semiconductor film. RTA is used as the heat treatment process here. RTA may be performed, for example, by turning on the eleven halogen lamps (infrared light) 15 set below the substrate, and the ten halogen lamps 15 set above the substrate, between 1 and 10 times (preferably between 2 and 6 times) at a cycle length of 1 to 60 seconds (preferably between 30 and 60 seconds) in a nitrogen atmosphere. Heat supplied from the halogen lamps is between 700 and 1300° C. (measured by a thermocouple embedded in a silicon wafer), and optimal heat treatment processing conditions differ in accordance with factors such as the states of the semiconductor film. The operator may therefore suitably determine the temperature. The heat treatment process is performed for 5 minutes at a temperature of 750° C. in a nitrogen atmosphere in this embodiment. (See FIG. 3B.)

Laser crystallization method is performed next to crystallize the semiconductor film. An excimer laser is irradiated in this embodiment such that its light is formed into a linear shape on an irradiation surface by using an optical system. The crystallinity of the semiconductor film is thus increased, but the distortions 13 develop in the semiconductor film due to the laser light irradiation. (See FIG. 3C.)

Patterning may then be performed to form a semiconductor film having a desired shape.

A second heat treatment process is then performed. Thermal annealing using an annealing furnace or RTA may be applied for the heat treatment process. The second heat treatment process is performed by thermal annealing using an annealing furnace in this embodiment. The heat treatment process is performed for 30 minutes at a temperature of 575° C. in a nitrogen atmosphere. (See FIG. 3D.)

The distortions in the semiconductor film are reduced after undergoing the heat treatment process as compared to the level present after the laser crystallization. Patterning is then performed to form a semiconductor film 19 having a desired shape. The electrical properties of a TFT can be made better provided that the semiconductor film is used in the manufacture of the TFT.

[Embodiment 4]

A method of reducing distortions of a semiconductor film by heat treatment that has undergone a manufacturing process differing from those of Embodiments 1 to 3 is explained in this embodiment using FIGS. 4A to 4D.

First, a glass substrate or a quartz substrate which each has a light emitting property is used as the substrate 10. A glass substrate is used as the substrate 10 in this embodiment.

A conductive film is formed, and etching is performed to form a conductive film 21 having a desired shape. There are no particular limitations placed on the conductive film material, and materials having thermal resistance are used. An element selected from the group consisting of Ta, W, Ti, Mo, Cu, Cr, and Nd, or an alloy or a chemical compound having one of the aforementioned elements as its main constituent, may be used to form the conductive film. Further, a semiconductor film into which an impurity element such as phosphorous has been doped, typically a crystalline silicon film, may also be used. An AgPdCu alloy may also be used. The conductive film is of course not limited to a single layer, and multiple layers may be used. A conductive film 306 is formed from a W film having a film thickness of 400 nm in this embodiment.

An insulating film such as a silicon oxide film, a silicon nitride film, or a silicon oxynitride film is then formed as an insulating film 22. A silicon oxide film having a thickness of 150 nm is formed by plasma CVD in this embodiment.

A semiconductor film 23 is formed on the insulating film. The semiconductor film 23 is formed from a semiconductor film having an amorphous structure by a known means (such as sputtering, LPCVD, or plasma CVD). The semiconductor film 23 is formed having a thickness of 25 to 80 nm (preferably from 30 to 60 nm). Although there are no limitations placed on the semiconductor film material, it is preferable to use silicon, a silicon germanium (SiGe) alloy, and the like. An amorphous silicon film having a film thickness of 55 nm is formed by plasma CVD in this embodiment. (See FIG. 4A.)

Laser crystallization is then performed to crystallize the semiconductor film. Laser crystallization method may of course also be performed after using another known crystallization process (such as a thermal crystallization method). The second higher harmonic wave of a YAG laser is irradiated in this embodiment such that its light is formed into a linear shape on an irradiation surface by using an optical system. The crystallization of the semiconductor film is thus realized, but the distortions 13 develop in the semiconductor film. (See FIG. 4B.)

A heat treatment process is performed next. Thermal annealing using an annealing furnace or RTA may be applied as the heat treatment process. If RTA is employed, for example, the eleven halogen lamps (infrared light) 15 set below the substrate, and the ten halogen lamps 15 set above the substrate, are turned on in a nitrogen atmosphere. Heat supplied from the halogen lamps is between 700 and 1300° C. (measured by a thermocouple embedded in a silicon wafer), and optimal heat treatment processing conditions differ in accordance with factors such as the state of the semiconductor film. The operator may therefore suitably determine the temperature. RTA is applied in this embodiment, and the heat treatment process is performed for 5 minutes at a temperature of 725° C. in a nitrogen atmosphere. (See FIG. 4C.)

The distortions in the semiconductor film are reduced after undergoing the heat treatment process as compared to the level present after the laser crystallization. Patterning is then performed to form a semiconductor film 24 in a desired shape. The electrical properties of a TFT can be made better provided that the semiconductor film is used in the manufacture of the TFT.

[Embodiment 5]

A method of manufacturing an active matrix substrate is explained in this embodiment using FIGS. 5A to 9. Note that a substrate upon which both a driver circuit and a pixel portion are formed is referred to as an active matrix substrate, for convenience' sake, throughout this specification.

First, a substrate 320 made from glass such as barium borosilicate glass or aluminum borosilicate glass, typically glass such as Corning Corporation #7059 glass or #1737 glass, is used in this embodiment. Note that substrates such as quartz substrates, silicon substrates, metallic substrates, and stainless steel substrates having an insulating film formed on the substrate surface may also be used as the substrate 320. Further, a plastic substrate having heat resisting properties capable of enduring the processing temperatures used in this embodiment may also be used.

A base film 321 made from an insulating film such as a silicon oxide film, a silicon nitride film, or a silicon oxynitride film is then formed on the substrate 320. A two layer structure is used as the base film 321 in this embodiment, but a single layer insulating film may also be used, and a structure in which more than two layers are laminated may also be used. As a first layer of the base film 321, a silicon oxynitride film 321*a* is formed having a thickness of 10 to 200 nm (preferably between 50 and 100 nm) by plasma CVD using $SiH_4$, $NH_3$, and $N_2O$ as reactant gasses. The silicon oxynitride film 321*a* is formed having a thickness of 50 nm in this embodiment (composition ratio: Si=32%, O=27%, N=24%, H=17%). As a second layer of the base film 321, a silicon oxynitride film 321*b* having a thickness of 50 to 200 nm (preferably between 100 and 150 nm) is formed by plasma CVD using $SiH_4$ and $N_2O$ as reactant gasses, and laminated on the silicon oxynitride film 321*a*. The silicon oxynitride film 321*b* is formed having a thickness of 100 nm in this embodiment (composition ratio: Si=32%, O=59%, N=7%, H=2%).

A semiconductor film 322 is formed next on the base film. As the semiconductor film 322, a semiconductor film is formed having an amorphous structure and a thickness of 25 to 80 nm (preferably from 30 to 60 nm) by using a known means (such as sputtering, LPCVD, or plasma CVD). There are no limitations placed on the semiconductor film material, but it is preferable that the semiconductor film be formed from a material such as silicon or a silicon germanium (SiGe) alloy. Laser crystallization method is then performed to crystallize the semiconductor film. Laser crystallization may of course also be preformed after using another known crystallization process (such as thermal crystallization, or thermal crystallization using a catalyst such as nickel). A laser crystallization method is applied in this embodiment.

Pulse oscillation type or continuous light emission type gas lasers, solid state lasers, metal lasers, and the like can be used with the laser crystallization method. Lasers such as continuous oscillation or pulse oscillation YAG lasers. $YVO_4$ lasers, YLF lasers, $YAlO_3$ lasers, glass lasers, ruby lasers, alexandrite lasers, and Ti:sapphire lasers exist as the solid state lasers. The gas lasers include continuous oscillation or pulse oscillation excimer lasers, Ar lasers, Kr lasers, and $CO_2$ lasers, while helium cadmium lasers, copper vapor lasers, and gold vapor lasers can be given as examples of the metal lasers. A method in which a laser beam emitted from a laser oscillator is concentrated into a linear shape by an optical system and then irradiated to the semiconductor film may be used for cases in which the above lasers are used. The crystallization conditions may be suitably selected by the operator, but the pulse oscillation frequency is set to 300 Hz, and the laser energy density is set between 100 and 800 $mJ/cm^2$ (typically from 200 to 700 $mJ/cm^2$) when an excimer laser is used. Further, the second higher harmonic wave is used if a YAG laser is employed, the pulse oscillation frequency is set from 1 to 300 Hz, and the laser energy density is set between 300 and 1000 $mJ/cm^2$ (typically from 350 to 800 $mJ/cm^2$). The laser beam concentrated into a linear shape having a width of 100 to 1000 $\mu m$, for example 400 $\mu m$, is then irradiated over the entire surface of the substrate. Irradiation may be performed at this point with an overlap ratio for the linear shape beam set between 50 and 98%. Further, if a continuous oscillation laser is used, then it is necessary to set the energy density between 0.01 and 100 $MW/cm^2$ (preferably from 0.1 to 10 $MW/cm^2$). A stage is then moved relative to the laser light at a speed on the order of 0.5 to 2000 cm/s, and a crystalline semiconductor film is formed.

The crystalline semiconductor film obtained is then patterned into a desired shape to form semiconductor films 402 to 406.

A heat treatment process is performed next in order to reduce distortion caused by the irradiation of laser light. Lamp light is irradiated in this embodiment. For example, the eleven halogen lamps (infrared light) 15 set below the substrate, and the ten halogen lamps 15 set above the substrate, may be turned on between 1 and 10 times (preferably between 2 and 6 times) at a cycle length of 1 to 60 seconds (preferably between 30 and 60 seconds) in a nitrogen atmosphere. Heat supplied from the halogen lamps is between 700 and 1300° C. (measured by a thermocouple embedded in a silicon wafer), and optimal heat treatment processing conditions differ in accordance with factors such as the state of the semiconductor film. The operator may therefore suitably determine the temperature. However, considering a mass production process, it is preferable that the heat treatment process be at a temperature on the order of 700 to 750° C. for 5 minutes or less. Heat is irradiated for 4 minutes in a 700° C. nitrogen atmosphere in this embodiment.

Doping of a very small amount of an impurity element (boron or phosphorous) may be performed after forming the semiconductor films 402 to 406 in order to control a TFT threshold value.

A gate insulating film 407 is formed next, covering the semiconductor films 402 to 406. The gate insulating film 407 is formed by an insulating film containing silicon with a thickness of 40 to 150 nm using plasma CVD or sputtering. In this embodiment, a silicon oxynitride film having a film thickness of 110 nm (composition ratios: Si=32%; O=59%; N=7%; H=2%) is formed by plasma CVD. The gate insulating film is of course not limited to a silicon oxynitride film, and other insulating films containing silicon may be used in a single layer or in a lamination structure.

Further, if a silicon oxide film is used, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good characteristics as a gate insulating film can be obtained by subsequently performing thermal annealing, at between 400 and 500° C., of the silicon oxide film thus manufactured.

Figure 5C:
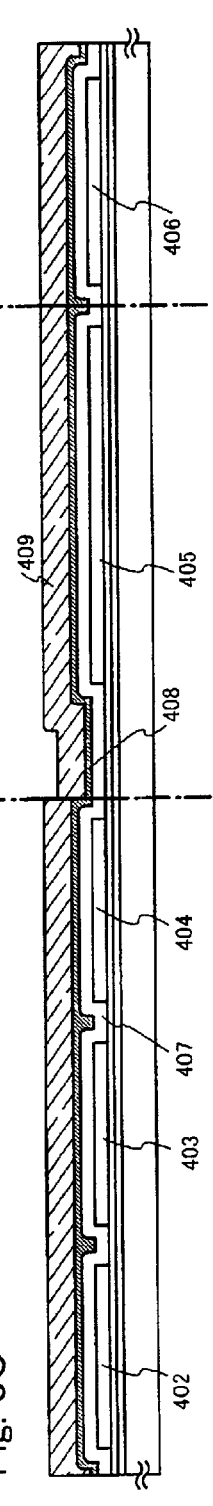
Figure 5D:
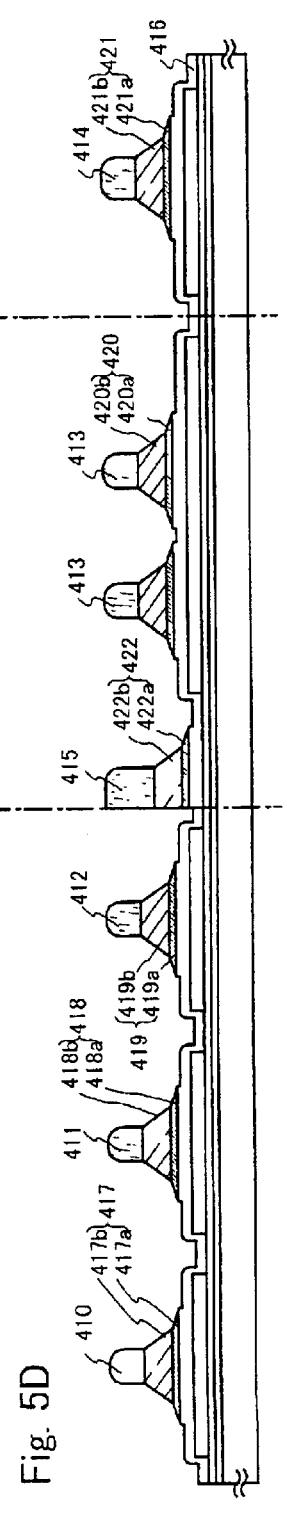

A first conductive film 408 having a film thickness of 20 to 100 nm, and a second conductive film 409 having a film thickness of 100 to 400 nm are then formed and laminated on the gate insulating film 407, as shown in FIG. 5C. The first conductive film 408, made from a TaN film having a film thickness of 30 nm, and the second conductive film 409, made from a W film having a film thickness of 370 nm, are formed and laminated in this embodiment. The TaN film is formed by sputtering, and sputtering of a Ta target is performed in a nitrogen atmosphere. Further, the W film is formed by sputtering using a W target. In addition, the W film can also be formed by thermal CVD using tungsten hexafluoride ($WF_6$). Whichever is used, it is necessary to be able to make the film become low resistance in order to use it as a gate electrode, and it is preferable that the resistivity of the W film be made equal to or less than 20 $\mu\Omega cm$. The resistivity can be lowered by enlarging crystal grains of the W film, but crystallization is inhibited for cases in which there are many impurity elements such as oxygen contained within the W film, and the film becomes high resistance. A high purity W target (99.9999% purity) is therefore used in sputtering. In addition, by forming the W film while taking sufficient care such that no impurities from within the gas phase are introduced at the time of film formation, a resistivity of 9 to 20 $\mu\Omega cm$ can be achieved.

Note that although the first conductive film 408 is TaN and the second conductive film 409 is W in this embodiment, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a crystalline silicon film, into which an impurity element such as phosphorous is doped may also be used, as may an AgPdCu alloy. In addition, the following may also be used: forming the first conductive film by a tantalum (Ta) film and combining it with the second conductive film formed from a W film; forming the first conductive film by a titanium nitride (TiN) film and combining it with the second conductive film formed from a W film; forming the first conductive film by a tantalum nitride (TaN) film and combining it with the second conductive film formed from an Al film; and forming the first conductive film from a tantalum nitride (TaN) film and combining it with the second conductive film formed by a Cu film.

Masks 410 to 415 are formed next from resist using a photolithography method, and a first etching process is performed in order to form electrodes and wirings. The first etching processing is performed in accordance with first and second etching conditions. An ICP (inductively coupled plasma) etching method is used in this embodiment as a first etching condition. A gas mixture of $CF_4$, $Cl_2$, and $O_2$ is used as an etching gas, the gas flow rates are set to 25:25:10 sccm, respectively, a plasma is generated by applying a 500 W RF electric power (13.56 MHz) to a coil shape electrode at a pressure of 1 Pa, and etching is performed. A Matsushita Electric Inc. Dry etching apparatus (model E645-ICP) using ICP is employed. A 150 W RF electric power (13.56 MHz) is also applied to the substrate side (sample stage), thereby effectively applying a negative self-bias voltage. The W film is etched under the first etching conditions, and the edge portion of the first conductive film is made into a tapered shape.

The etching conditions are changed to a second etching condition without removing the resist masks 410 to 415. A gas mixture of $CF_4$ and $Cl_2$ is used as an etching gas, the gas flow rates are set to 30:30 sccm, respectively a plasma is generated by applying a 500 W RF electric power (13.56 MHz) to a coil shape electrode at a pressure of 1 Pa, and etching is performed for approximately 30 seconds. A 20 W RF electric power (13.56 MHz) is also applied to the substrate side (sample stage), thereby effectively applying a negative self-bias voltage. The W film and the TaN film are both etched by on the same order by the second etching conditions using the gas mixture of $CF_4$ and $Cl_2$. Note that the etching time may be increased on the order of 10 to 20% in order to perform etching such that no residue remains on the gate insulating film.

Edge portions of the first conductive film and the second conductive film are made into a tapered shape in accordance with the effect of a bias voltage, applied to the substrate side, by making the shapes of the resist masks suitable with the above-mentioned first etching condition. The angle of the tapered portions is from 15 to 45. First shape conductive films 417 to 422 (first conductive films 417a to 422a, and second conductive films 417b to 422b) are thus formed from the first conductive films and the second conductive films by the first etching process. Reference numeral 416 denotes a gate insulating film, and regions not covered by the first shape conductive films 417 to 422 become thinner by approximately 20 to 50 nm through etching.

Figure 6A:
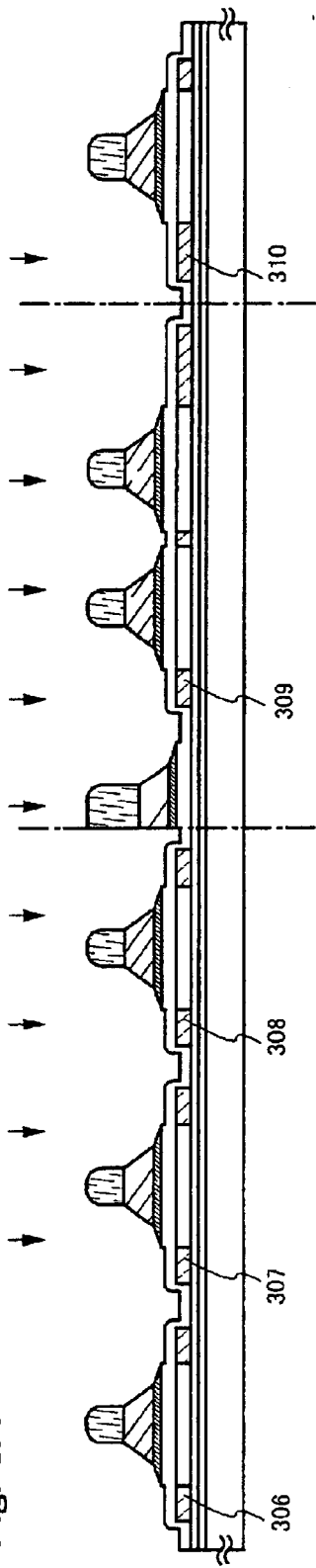
FIGS. 6A to 6C are cross sectional diagrams showing the example of the process of manufacturing a pixel TFT and driver circuit TFTs.

A first doping process is then performed without removing the resist masks (see FIG. 6A). The doping process may be performed by ion doping or ion injection. Ion doping is performed with process conditions in which the dosage is set from $1\times10^{13}$ to $5\times10^{15}/cm^2$, and the acceleration voltage is set between 60 to 100 keV. Doping is performed in this embodiment with the dosage set to $1.5\times10^{15}/cm^2$, and the acceleration voltage set to 80 keV. An element belonging to the group 15 of the periodic table, typically phosphorous (P) or arsenic (As) is used as an impurity element which imparts n-type conductivity. Phosphorous (P) is used here. In this case the conductive films 417 to 421 act as masks with respect to the impurity element which imparts n-type conductivity, and high concentration impurity regions 306 to 310 are formed in a self-aligning manner. The impurity element which imparts n-type conductivity is added to the first high concentration impurity regions 306 to 310 at a concentration in a range of $1\times10^{20}$ to $1\times10^{21}/cm^3$.

A second etching process is performed next without removing the masks made from resist. $CF_4$, $Cl_2$, and $O_2$ are used as etching gasses here, and the W film is selectively etched. At this time, second conductive films 428b to 433b are formed by the second etching process. The first conductive films 417a to 422a are hardly etched, however, and form second shape conductive films 428 to 433 having first conductive films 428a to 433a, respectively.

Figure 6B:
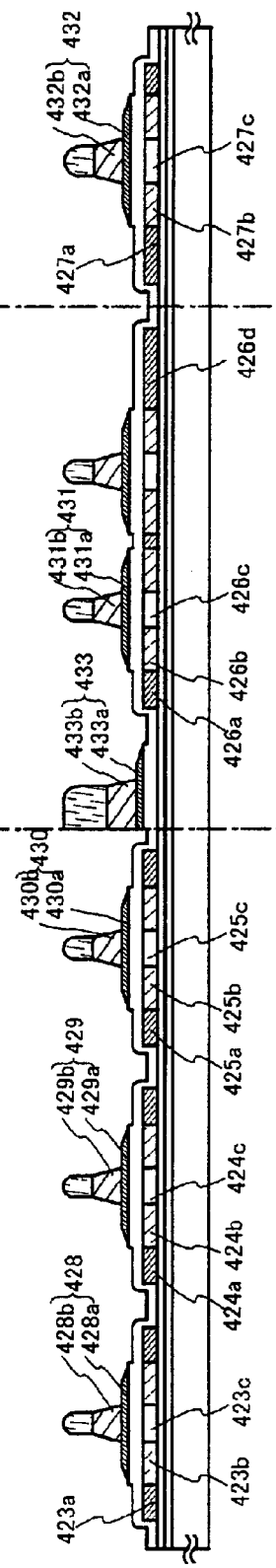

A second doping process is performed next as shown in FIG. 6B without removing the resist masks. The dosage amount is made lower than that of the first doping process, and an impurity element that imparts n-type conductivity is introduced at a high acceleration voltage of 70 to 120 keV. The dosage is set to $1.5\times10^{14}/cm^2$ in this embodiment, and doping is performed with an acceleration voltage of 90 keV The impurity element is also introduced to the semiconductor films under the first conductive films 428a to 433a by the second doping process, with the second conductive films 428b to 433b used as masks. New second high concentration impurity regions 423a to 427a, 426d and low concentration impurity regions 423b to 427b are thus formed.

Figure 6C:
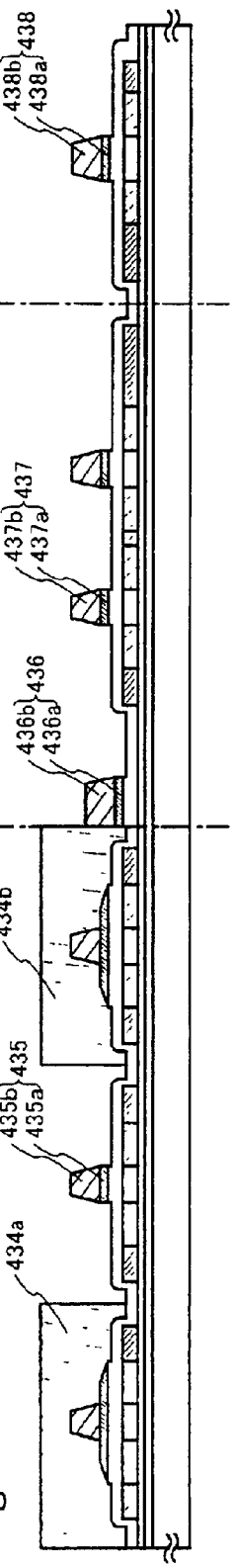

Next, after removing the resist masks, new resist masks 434a and 434b are formed, and a third etching process is performed as shown in FIG. 6C. $SF_6$ and $Cl_2$, are used as etching gasses, the gas flow rate ratio is set to 50:10 sccm, and etching is performed for approximately 30 seconds after applying a 500 W RF electric power (13.56 MHz) to a coil shape electrode under a pressure of 1.3 Pa, generating a plasma. A 10 W RF electric power (13.56 MHz) is also applied to the substrate side (sample stage), thereby effectively applying a negative self-bias voltage. In this way, by the third etching process, the TaN films of the p-channel TFT and the pixel portion TFT (pixel TFT) are thus etched to form third shape conductive films 435 to 438.

The resist masks are then removed, and the gate insulating film 416 is selectively removed while using the second shape conductive films 428 and 430, and the second shape conductive films 435 to 438 as masks. Insulating layers 439 to 444 are thus formed. (See FIG. 7A.)

Next, new masks 445a to 445c made from resist are formed and a third doping process is performed. Impurity regions 446a to 446c and 447a to 447c, to which an impurity element which imparts a conductivity type opposite to that of the above single conductivity type is added, are formed in accordance with the third doping process in the semiconductor films which become active layers of the p-channel TFTs. The second conductive films 435a and 438a are used as masks with respect to the impurity element, and an impurity element which imparts p-type conductivity is added to form the impurity regions in a self-aligning manner. The impurity regions 446a to 446c and 447a to 447c are formed by ion doping using diborane ($B_2H_6$) in this embodiment (see FIG. 7B). The semiconductor films for forming the n-channel TFT are covered with the resist masks 445a to 445c when performing the third doping process. Phosphorous is added at different concentrations into the impurity regions 446 and 447 by the first doping process and by the second doping process. However, by performing doping such that the concentration of the impurity element which imparts p-type conductivity becomes from $2\times10^{20}$ to $2\times10^{21}/cm^3$ in each of the regions, no problems develop in making the regions function as source regions and drain regions of the p-channel TFT. This embodiment has an advantage in that portions of the semiconductor films which become the active layers of the p-channel TFT are exposed, and therefore the impurity element (boron) is easily added.

The impurity regions are thus formed in the respective semiconductor films by the steps up though this point.

A first interlayer insulating film 461 is formed next after removing the resist masks 445a to 445c. The first interlayer insulating film 461 is formed from an insulating film containing silicon, having a thickness of 100 to 200 nm, by using plasma CVD or sputtering. A silicon oxynitride film having a thickness of 150 nm is formed by plasma CVD in this embodiment. The first interlayer insulating film 461 is of course not limited to a silicon oxynitride film, and other insulating films containing silicon may also be used, as a single layer or a lamination structure.

Figure 7A:
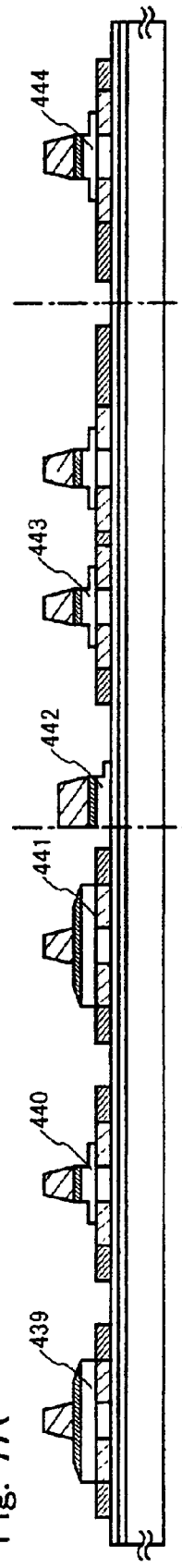
FIGS. 7A to 7C are cross sectional diagrams showing the example of the process of manufacturing a pixel TFT and driver circuit TFTs.
Figure 7B:
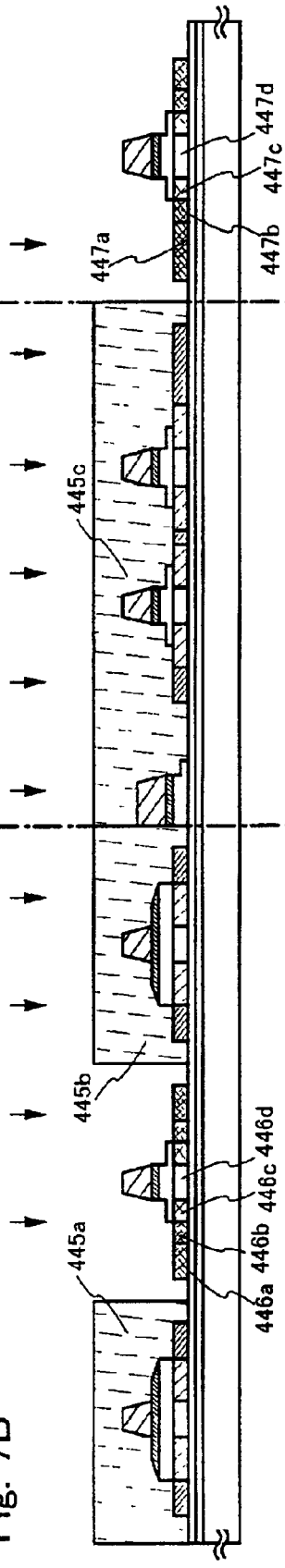
Figure 7C:
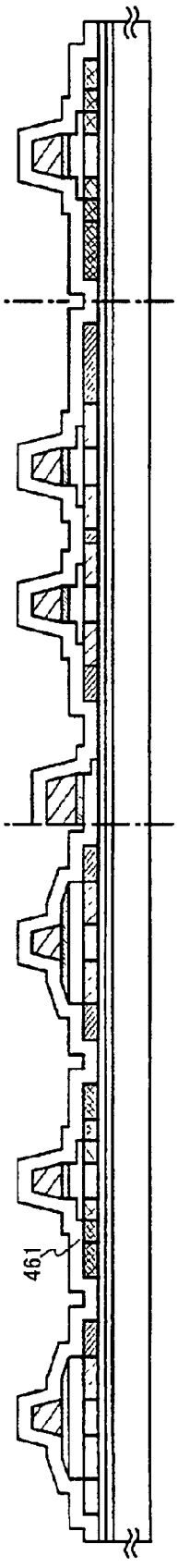

Recovery of the crystallinity of the semiconductor film and a process of activating the impurity elements added to the respective semiconductor films are performed next by a heat treatment process, as shown in FIG. 7C. Methods such as thermal annealing using an annealing furnace, RTA, and laser annealing may be performed for the heat treatment process. Thermal annealing may be performed with an oxygen concentration equal to or less than 1 ppm, preferably equal to or less than 0.1 ppm, in a nitrogen atmosphere at 400 to 700° C., typically between 500 and 550° C. It is preferable to use pulse oscillation type or continuous oscillation type gas lasers, solid state lasers, metal lasers, and the like for laser annealing. Note that pulse oscillation or continuous oscillation lasers such as YAG lasers, $YVO_4$ lasers, YLF lasers, $YAlO_3$ lasers, glass lasers, ruby lasers, alexandrite lasers, and Ti:sapphire lasers exist as the solid state lasers. The gas lasers include continuous oscillation or pulse oscillation excimer lasers. Ar lasers, Kr lasers, and $CO_2$ lasers, while helium cadmium lasers, copper vapor lasers, and gold vapor lasers can be given as examples of the metal lasers. It is necessary that the laser light energy density be on the order of 0.01 to 100 $MW/cm^2$ (preferably between 0.01 and 10 $MW/cm^2$) if a continuous oscillation laser is used, and the substrate moves relative to the laser light at a speed of 0.5 to 2000 cm/s. Further, it is preferable that the laser energy density be from 50 to 1000 $mJ/cm^2$ (typically between 50 and 500 $mJ/cm^2$) with a frequency of 300 Hz if a pulse oscillation laser is used. Irradiation may be performed at this point with an overlap ratio set between 50 and 98%. An activation process is performed by a heat treatment process using an annealing furnace in this embodiment, at a temperature of 550° C. for 4 hours.

Further, a heat treatment process may also be performed before the formation of a first interlayer insulating film 461. However, if the wiring material used is weak with respect to heat, then it is preferable to perform a heat treatment process after forming an interlayer insulating film (an insulating film having silicon as its main constituent, for example a silicon nitride film) in order to protect the wirings and the like, as in this embodiment.

Then a heat treatment process can also be performed (for 1 to 12 hours at 300 to 550° C.). This process is one of terminating dangling bonds in the semiconductor films by hydrogen contained within the first interlayer insulating film 461. The semiconductor films can be hydrogenated whether or not the first interlayer insulating film exists. Plasma hydrogenation (using hydrogen excited by a plasma), and a heat treatment process for 1 to 12 hours at a temperature of 300 to 450° C. in an atmosphere containing hydrogen of from 3 to 100% may also be performed as other means of hydrogenation.

A second interlayer insulating film 462 made from an inorganic insulating film material or from an organic insulating film material is formed next on the first interlayer insulating film 461. An acrylic resin film having a film thickness of 1.6 µm is formed in this embodiment, and the material used may have a viscosity from 10 to 1000 cp, preferably between 40 and 200 cp. A material in which unevenness is formed on its surface is used.

In order to prevent specular reflection, the surface of a pixel electrode is made uneven by forming a second interlayer insulating film from a material which forms an uneven surface shown in FIG. 18 of this embodiment. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film which covers the convex portion.

A film having a level surface may also be used as the second interlayer insulating film 462. In this case, it is preferable that the surface be made uneven by an added process such as a known sandblasting process or etching process to prevent specular reflection, and thereby increasing whiteness by scattering reflected light.

Wirings 463 to 467 for electrically connecting respective impurity regions are then formed in order in a driver circuit 506. Note that a lamination film of a Ti film having a thickness of 50 nm and an alloy film (an alloy of Al and Ti) having a thickness of 500 nm is patterned in order to form the wirings.

Furthermore, a pixel electrode 470, a gate wiring 469, and a connection electrode 468 are formed in a pixel portion 507. (See FIG. 8.) An electrical connection is formed with the pixel TFT and the source wiring 436 (lamination of impurity regions 436a and 436b) by the connection electrode 468. Further, the gate wiring 469 forms an electrical connection with the gate electrode of the pixel TFT. The pixel electrode 470 forms an electrical connection with the drain region 426d of the pixel TFT, and in addition, forms an electrical connection with the semiconductor film 406 which functions as one electrode forming a storage capacitor. It is preferable to use a material having superior reflectivity, such as a film having Al or Ag as its main constituent, or a lamination film of such films, as the pixel electrode 470.

A CMOS circuit composed of an n-channel TFT 501 and a p-channel TFT 502, a driver circuit having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 423c; the low concentration impurity region 423b (GOLD region) which overlaps with the first conductive film 428a that structures a portion of the Gate electrode; and the high concentration impurity region 423a which functions as a source region or a drain region. The p-channel TFT 502, which forms the CMOS circuit with the n-channel TFT 501 by an electrical connection through an electrode 466, has: a channel forming region 446d; impurity regions 446b and 446c which are formed outside the gate electrode; and a high concentration impurity region 446a which functions as a source region or a drain region. Further, the n-channel TFT 503 has: a channel forming region 425c; the low concentration impurity region 425b (GOLD region) which overlaps with the first conductive film 430a that structures a portion of the gate electrode; and the high concentration impurity region 425a which functions as a source region or a drain region.

The pixel TFT 504 of the pixel portion has: a channel forming region 426c; the low concentration impurity region 426b (LDD region) formed on the outside of the gate electrode; and the high concentration impurity region 426a which functions as a source region or a drain region. Further, an impurity element which imparts p-type conductivity is added to the impurity regions 447a and 447b, respectively, which function as one electrode of the storage capacitor 505. The storage capacitor 505 comprises an electrode (lamination of 438a and 438b) and the impurity regions 447a to 447c, with the insulating film 444 functioning as a dielectric.

Edge portions of the pixel electrodes are disposed so as to overlap with source wirings such that gaps between the pixel electrodes block light, without using a black matrix, with the pixel structure of this embodiment.

Figure 8:
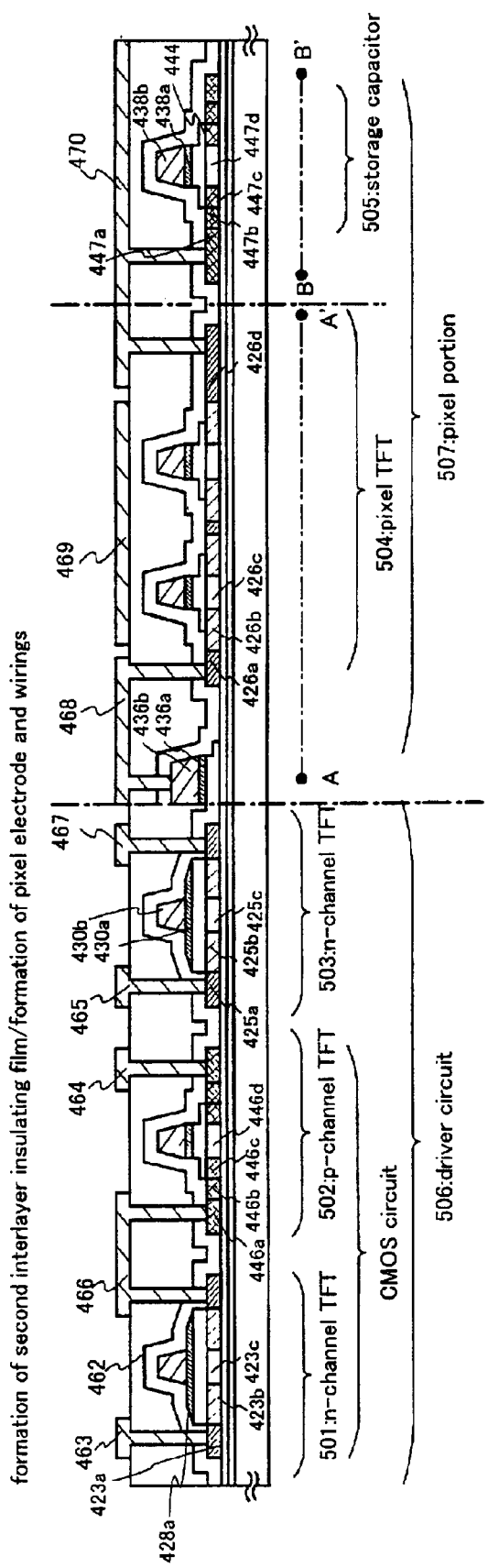
FIG. 8 is a cross sectional diagram showing the example of the process of manufacturing a pixel TFT and driver circuit TFTs.
Figure 9:
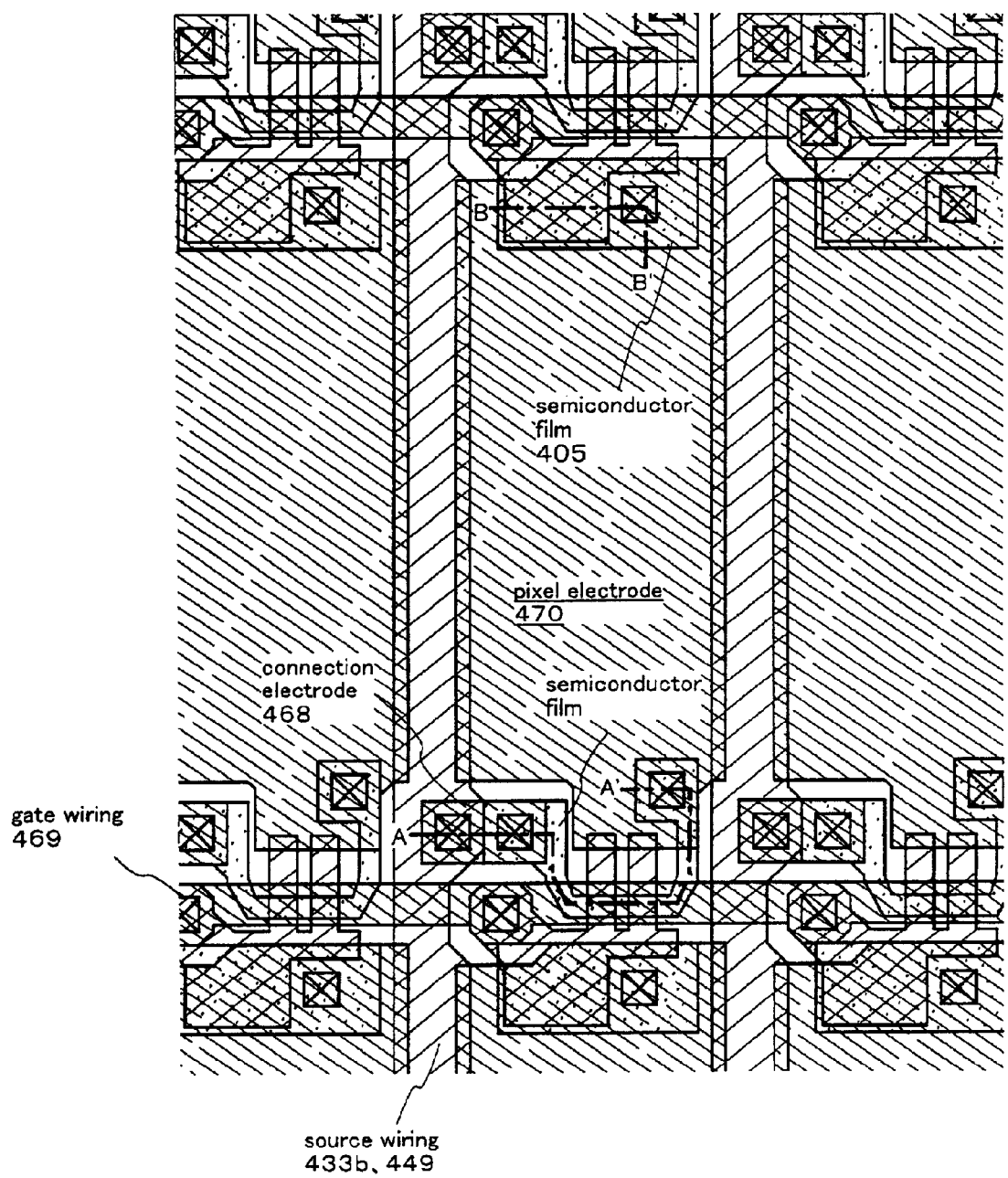
FIG. 9 is an upper surface diagram showing a pixel of a pixel portion.

An upper surface diagram of the pixel portion of the active matrix substrate manufactured by this embodiment is shown in FIG. 9. Note that the same reference symbols are used for portions corresponding to those in FIGS. 5A to 8.

A chain line A-A' in FIG. 8 corresponds to a cross sectional diagram cut along a chain line A-A' within FIG. 9. Further, a chain line B-B' in FIG. 8 corresponds to a cross sectional diagram cut along a chain line B-B' within FIG. 9.

Note that it is possible to freely combine this embodiment with Embodiments 1 to 4.

[Embodiment 6]

Figure 10:
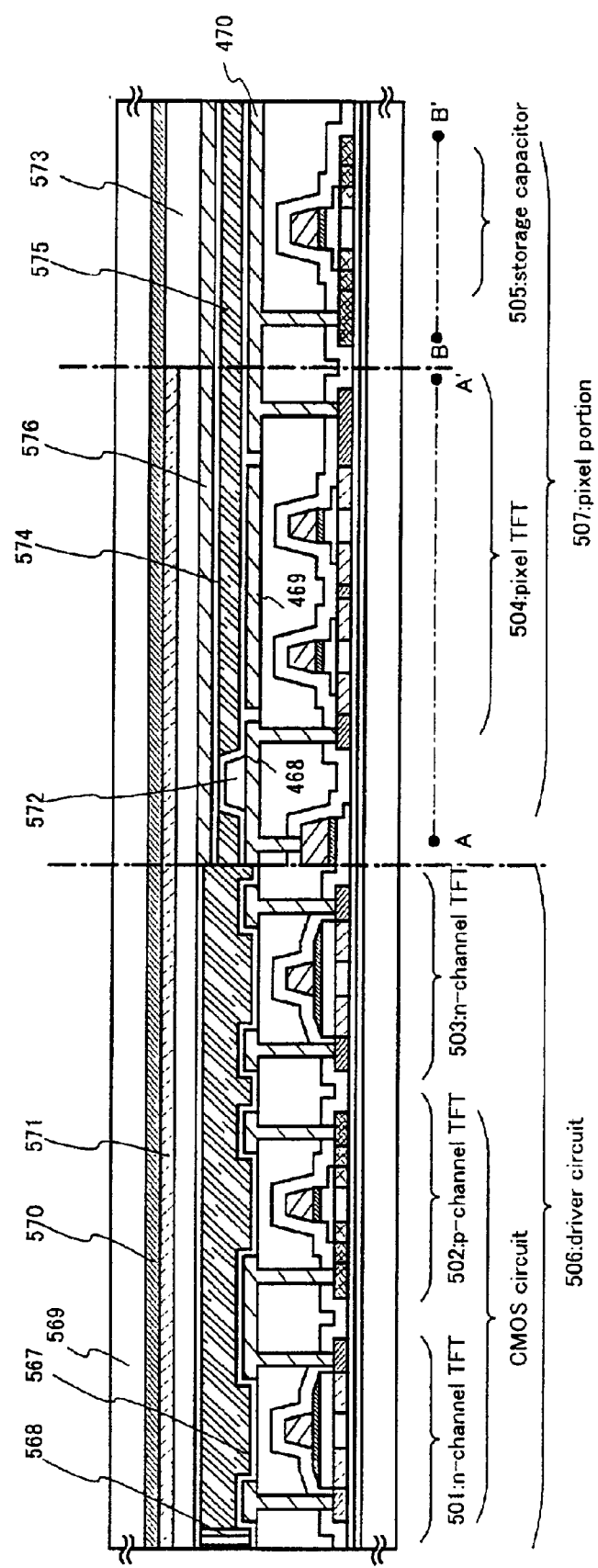
FIG. 10 is a cross sectional diagram showing a process of manufacturing an active matrix liquid crystal display device.

A process of manufacturing a reflection type liquid crystal display device from the active matrix substrate manufactured in Embodiment 5 is explained below in this embodiment. FIG. 10 is used in the explanation.

An active matrix substrate in the state of FIG. 8 is first obtained in accordance with Embodiment 5, an orientation film 567 is then formed on at least the pixel electrode 470 on the active matrix substrate of FIG. 8, and a rubbing process is performed. Note that, before forming the orientation film 567 in this embodiment, column shaped spacer 572 is formed in desired positions by patterning an organic resin film, such as an acrylic resin film, in order to maintain a gap between substrates. Further, spherical shape spacers may also be distributed over the entire surface of the substrate as a substitute for the column shaped spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Embodiment 5 is used in this embodiment. Therefore, with the top surface diagram of the pixel portion of Embodiment 5 shown in FIG. 9, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask.

An opposing electrode 576 made from a transparent conductive film is formed on the leveling film 573 over at least the pixel portion, an orientation film 574 is formed over the entire surface of the opposing substrate, and a rubbing process is performed.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the column shape spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 10 is thus completed. The active matrix substrate or the opposing substrate is then cut into a desired shape if necessary. In addition, a polarizing plate (not shown in the figure) is attached to only the opposing substrate. An FPC is then attached using a known technique.

A liquid crystal display panel thus manufactured as described above can be used as a display portion in various types of electronic equipment.

Note that it is possible to freely combine this embodiment with Embodiments 1 to 5.

[Embodiment 7]

Figure 11:
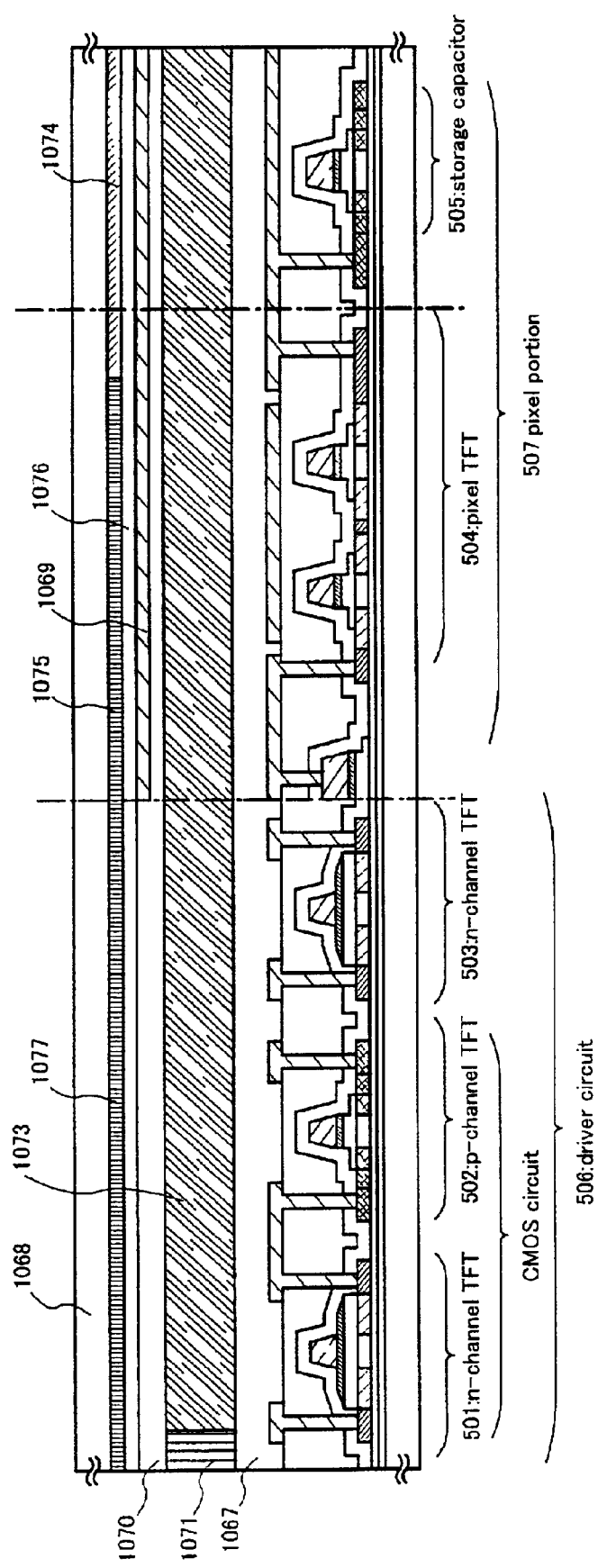
FIG. 11 is a cross sectional diagram showing a process of manufacturing an active matrix liquid crystal display device.

In this embodiment, the process of manufacturing an active matrix liquid crystal display device, which is different from that manufactured in Embodiment 6, from the active matrix substrate manufactured in Embodiment 5 is described below. FIG. 11 is used for explanation.

First, in accordance with Embodiment 5, the active matrix substrate in a state shown in FIG. 8 is obtained, and thereafter, a orientation film 1067 is formed on the active matrix substrate of FIG. 8, and is subjected to a rubbing process. Note that, in this embodiment, before the formation of the orientation film 1067, a column spacer for maintaining a gap between the substrates is formed at a desired position by patterning an organic resin film such as an acrylic resin film. Further, spherical spacers may be scattered on the entire surface of the substrate in place of the column spacer.

Next, an opposing substrate 1068 is prepared. On the opposing substrate 1068, there are provided color filters that a coloring layer 1074 and a light shielding layer 1075 are arranged with respect to the respective pixels. Further, the driver circuit portion is also provided with a light shielding layer 1077. A leveling film 1076 is provided to cover the color filters and the light shielding layer 1077. Next, in the pixel portion an opposing electrode 1069 is formed from a transparent conductive film on the leveling film 1076, a orientation film 1070 is formed on the entire surface of the opposing substrate, and a rubbing process is conducted thereon.

Then, the active matrix substrate on which a pixel portion and a driver circuit are formed is stuck with the opposing substrate by a sealing material 1071. A filler is mixed in the sealing material 1071, and the two substrates are stuck with each other while keeping a uniform gap by this filler and the column spacer. Thereafter, a liquid crystal material 1073 is injected between both the substrates to seal the substrates completely by a sealant (not shown). A known liquid crystal material may be used as the liquid crystal material 1073. Thus, the active matrix liquid crystal display device shown in FIG. 11 is completed. Then, if necessary, the active matrix substrate and the opposing substrate are parted into desired shapes. In addition, by using a known technique, a polarizing plate or the like may be suitably provided. Then, an FPC is stuck with the substrate using a known technique.

The liquid crystal display panel obtained in this way can be used as a display portion of various electronic devices.

This embodiment can be freely combined with Embodiments 1 to 5.

[Embodiment 8]

An example of manufacturing a light emitting device using the present invention is explained in this embodiment by using an example in which a TFT structure differs from that of the active matrix substrate produced by Embodiment 5. The term light emitting device is a generic term within this specification denoting display panels in which light emitting elements formed on a substrate are sealed between the substrate and a covering material, and display modules in which an IC is mounted in the display panel. Note that the light emitting elements have a layer containing an organic compound in which electroluminescence generated by application of an electric field is obtained, an anode layer, and a cathode layer. Further, light emitted during the return to a base state from a singlet excitation state (fluorescence)

and light emitted during the return to a base state from a triplet excitation state (phosphorescence) exist as types of the electroluminescence in the organic compounds, and either one, or both of them, may be used.

Furthermore, all layers formed between an anode and a cathode in a light emitting element are defined as organic light emitting layers within this specification. Specifically, light emitting layers, hole injection layers, electron injection layers, hole transport layers, and electron transport layers are included in the organic light emitting layers. Light emitting elements basically have a structure in which an anode layer, a light emitting layer, and a cathode layer are laminated in order. In addition to this structure, other structures can also be used, such as one in which an anode layer, a hole injection layer, a light emitting layer, and a cathode layer, or one in which an anode layer a hole injection layer, a light emitting layer, an electron transport layer, and a cathode are laminated in order.

Figure 12:
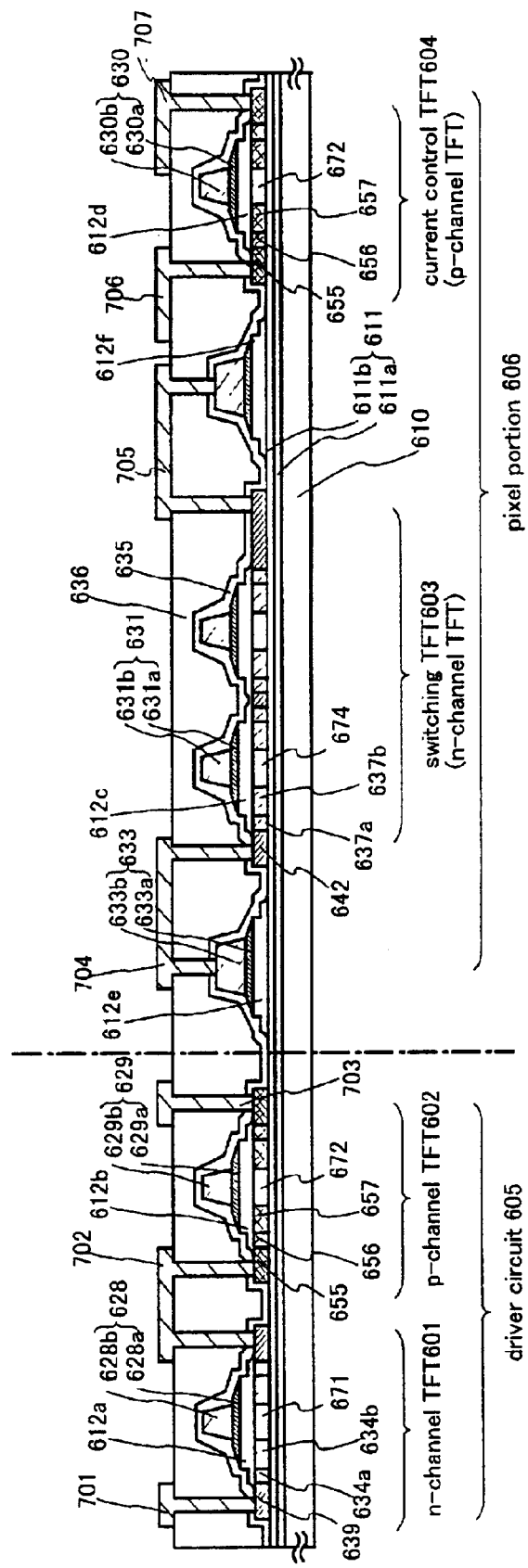
FIG. 12 is a cross sectional diagram showing an example of a process of manufacturing a pixel TFT and driver circuit TFTs.

A driver circuit 605 having an n-channel TFT 601 and a p-channel TFT 602, and a pixel portion 606 having a switching TFT 603 and a current control TFT 604 are formed in the active matrix substrate shown in FIG. 12.

A base film 611 is formed on a substrate 610, and the TFTs are then formed by forming channel forming regions, source regions, drain regions. LDD regions, and the like in semiconductor films on the base film. The semiconductor films are formed using the present invention, similar to those of embodiments 1 to 6.

Gate electrodes 628 to 631 formed on gate insulating films 612a to 612d have lamination structures made from first conductive films 628a to 631a and second conductive films 628b to 631b, and they are characterized in that their edge portions are formed so as to have a tapered shape. This shape is formed by etching at least three times, and impurities are introduced to the semiconductor films by utilizing gate electrode shapes formed by each of the etching processes.

Specifically, a first shape gate electrode having a tapered shape in its edge portions due to a first etching process is used as a mask, a first doping process is performed in a self-aligning manner, and a high concentration impurity region is formed. Next, a second conductive film is selectively etched to form a second shape gate electrode. A second doping process is performed utilizing tapered shape portions of the first conductive film in the second shape gate electrode, forming a low concentration impurity region. The tapered portions of the first conductive film are then partially etched to form a third shape gate electrode. The insulating film is also etched simultaneously at this point, thereby forming an insulating film 621. Masks are then formed on the n-channel TFT and the pixel portion, and a third doping process is performed. An impurity region, in which an impurity element is added to the semiconductor film which becomes an active layer of the p-channel TFT and the impurity element imparts a conductivity type opposite to that of the single conductivity type that has already been added, is formed by the third doping process.

An LDD region formed by utilizing the tapered shape portions of the first conductive film in the second shape gate electrode is formed in order to increase the reliability of the n-channel TFT. Degradation of an on current due to hot carrier effects is thus prevented. Ions of the impurity elements are accelerated by an electric field by an ion doping method, and then added to the semiconductor film through a gate insulating film in the edge portions of the gate electrode, and in the vicinity of the edge portions, in forming the LDD region.

An LDD region 634 (634a, 634b), and a source region or drain region 639 are thus formed on the outside of a channel forming region 671 in the n-channel TFT 601, and a portion 634b of the LDD region 634 is formed so as to overlap with the gate electrode 628. The p-channel TFT 602 is given a similar structure, and is formed from a channel forming region 672, LDD regions 656 and 657, and a source region or drain region 655. Note that although a single gate structure is used in this embodiment, a double gate structure or a triple gate structure may also be employed.

In the pixel portion 606, the switching TFT 603 formed by the n-channel TFT is formed having a multi-gate structure in order to reduce an off current, and an LDD region 637 (637a, 637b) and a source region or drain region 642 are formed on the outside of a channel forming region 674. Further, LDD regions 656 and 657, and a source region or drain region 655 are formed on the outside of a channel forming region 672 in the current control TFT 604 formed by the p-channel TFT. Note that although the current control TFT 604 has a single gate structure in this embodiment, a double gate structure or a triple gate structure may also be used.

An interlayer insulating film is formed by a first interlayer insulating film 635 having a thickness of 50 to 500 nm and made from an inorganic material such as silicon oxide, silicon nitride, or silicon oxynitride, and a second interlayer insulating film 636 made from an organic insulating material such as polyimide, acrylic, polyimide amide, or BCB (benzocyclobutene). The surface can be easily made level by thus forming the second interlayer insulating film by using an organic insulating material. Further, organic resin materials generally have low dielectric constants, and therefore parasitic capacitance can be lowered. However, organic resin materials have hygroscopic properties and are not suited to be used as protective films, and therefore it is preferable to combine the second interlayer insulating film with the first interlayer insulating film 635.

A resist mask is formed next in a predetermined pattern, and contact holes for reaching the source region or the drain region which are formed in the respective semiconductor films are formed. Dry etching is performed in order to form the contact holes. In this case the second interlayer insulating film 636 made from an organic resin material is etched first using a mixed gas of $CF_4$, $O_2$, and He, and the first interlayer insulating film 635 is etched next after changing the etching gas to $CF_4$ and $O_2$.

A conductive metallic film is then formed by sputtering or vacuum evaporation, a resist mask pattern is formed, and wirings 701 to 707 are formed by etching. An active matrix substrate can thus be formed.

Figure 13:
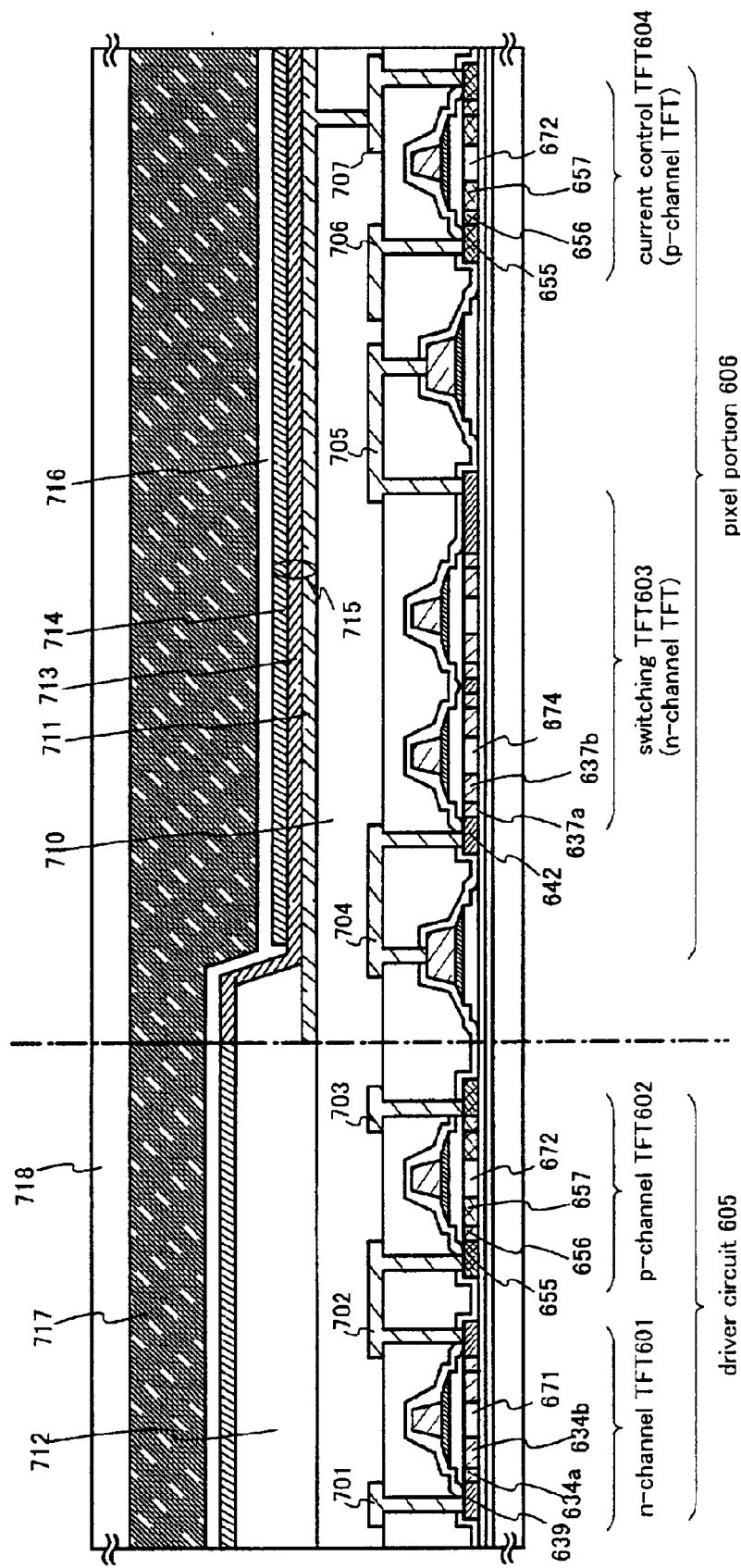
FIG. 13 is a cross sectional structure diagram of a driver circuit and a pixel portion of a light emitting device.

A light emitting device, as shown in FIG. 13, can be formed by using the active matrix substrate shown in FIG. 12. The wiring 706 is a source wiring (corresponding to an electric current supply line) of the current control TFT, and the reference numeral 707 is an electrode that is electrically connected to a pixel electrode 711 by overlapping with the pixel electrode 711 of the current control TFT.

Note that the reference numeral 711 denotes a pixel electrode (anode of the light emitting element) made from a transparent conductive film. A compound of indium oxide and tin oxide, a compound of indium oxide and zinc oxide, zinc oxide, tin oxide, and indium oxide can be used as the transparent conductive film. Further, gallium may also be added to the aforementioned transparent conductive films. The pixel electrode 711 is formed on a level interlayer insulating film 710 before forming the above-mentioned wirings. It is extremely important in this embodiment to level steps due to the TFTs by using the leveling film 710 made from a resin. The light emitting layers formed later are extremely thin, and therefore light emitting failures may occur due to the existence of steps. It is consequently preferable to perform leveling before forming the pixel electrode so that the light emitting layers can be formed on as level a surface as possible.

A bank 712 is formed as shown in FIG. 13 after forming the wirings 701 to 707. The bank 712 may be formed by patterning an insulating film containing silicon, or an organic resin film, having a thickness of 100 to 400 nm.

Note that it is necessary to exercise caution against damage to the element due to static electricity during film formation because the bank 712 is an insulating film. Carbon particles or metallic particles are added to the insulating film that becomes a material of the bank 712 in this embodiment, thereby, the restivity is lowered, and the generation of static electricity is controlled. The amount of carbon particles or metallic particles added may be regulated so that the Festivity becomes $1\times10^6$ to $1\times10^{12}$ Um (preferably between $1\times10^8$ and $1\times10^{10}$ Um).

A light emitting layer 713 is formed on the pixel electrode 711. Note that while only one pixel is shown in FIG. 13, separate light emitting layers are formed corresponding to respective colors of R (red), G (green), and B (blue) in this embodiment. Further, a low molecular weight organic light emitting material may be formed by an evaporation method in this embodiment. Specifically, a lamination structure may be formed in which a copper phthalocyanine (CuPc) film having a thickness of 20 nm is formed as a hole injection layer, and a tris-8-aluminum quinolinolate complex ($Alq_3$) film having a thickness of 70 nm may be formed on the CuPc film as a light emitting layer. The color of light emitted can be controlled by adding to $Alq_3$ a fluorescing pigment such as quinacridone, perylene, or DCM1.

Note that the above example is one example of organic light emitting materials capable of being used as the light emitting layer, and the light emitting layer need not be limited to these. A light emitting layer (layers for emitting light and for performing transport of carriers for the light emission) in which a light emitting layer, a charge transport layer, and a charge injection layer are freely combined may also be formed. For example, although an example of using low molecular weight organic light emitting materials as the light emitting layer is shown in this embodiment, intermediate molecular weight organic light emitting materials and high molecular weight organic light emitting materials may also be used. Note that, within this specification, organic light emitting materials that do not have sublimation properties, and in which the number of molecules is equal to or less than 20 or the molecular length is less than or equal to 10 $\mu$m, are taken as intermediate molecular weight organic light emitting materials. Furthermore, a lamination structure in which a polythiophene (PEDOT) film having a thickness of 20 nm is formed by a spinning application method as a hole injection layer, and paraphenylene vinylene (PPV) film having a thickness on the order of 100 nm is formed as a light emitting layer on the hole injection layer, may be taken as an example of using a high molecular weight organic light emitting material. Note that light emitting wavelengths from red to blue can be selected if ŏ cojugate polymers of the PPV are used. Further, it is also possible to use inorganic materials such as silicon carbide as electron transport layers and electron injection layers. Known materials can be used for these organic light emitting materials and inorganic materials.

Next, a cathode 714 is formed from a conductive film on the light emitting layer 713. An alloy film of aluminum and lithium is used as the conductive film in this embodiment. A known MgAg film (an alloy film of magnesium and gold) may of course also be used. A conductive film made from an element belonging to the group 1 or the group 2 of the periodic table, or a conductive film to which the above elements are added, may be used as the cathode material.

A light emitting element 715 is completed at the point up through the formation of the cathode 714. Note that the light emitting element 715 mentioned here indicates a diode formed by the pixel electrode (anode) 710, the light emitting layer 713, and the cathode 714.

It is effective to form a passivation film 716 so as to cover the entire light emitting element 715. An insulating film containing a carbon film, a silicon nitride film, or a silicon oxynitride film is used as the passivation film 716, and a single layer or a lamination of the insulating film may be used.

It is preferable to use a film having good coverage as the passivation film, and the use of a carbon film, in particular a DLC (diamond like carbon) film is effective, it is possible to form the DLC film within a temperature range of room temperature to 100° C., and therefore the film can easily be formed on the light emitting layer 713 which has a low resistance to heat. Further, the DLC film has a high blocking effect with respect to oxygen, and it is thus possible to control oxidation of the light emitting layer 713. A problem in that the light emitting layer 713 is oxidized during a period up through a sealing process succeeding to forming of the passivation film can therefore be prevented.

In addition, a sealant 717 is provided on the passivation film 716, and a covering material 718 is bonded. An ultraviolet setting resin may be used as the sealant 717, and it is effective to provide therein a substance having a hygroscopic effect or an oxidation preventing effect. Furthermore, a glass substrate, a quartz substrate, or a plastic substrate (including a plastic film) in which a carbon film (preferably a diamond like carbon film) is formed on both the sides of the substrate is used as the covering material 718 in this embodiment.

A light emitting device having a structure like that shown in FIG. 13 is thus completed. Note that processes from the completion of the formation of the bank 712 through the formation of the passivation film 716 may be performed using a multi-chamber (or in-line) film formation apparatus. This is effective in processing in succession without exposure to the atmosphere. Further, it is also possible to make additional advancements such that the processes up through the bonding of the covering, material 718 are successively performed without exposure to the atmosphere.

The n-channel TFTs 601 and 602, the switching TFT (n-channel TFT) 603, and the current control TFT (n-channel TFT) 604 are thus formed on an insulator 501 having a plastic substrate as a core. The number of masks necessary for the manufacturing process up to this point is less than the number for a conventional active matrix light emitting device.

In other words, the TFT manufacturing process can be greatly simplified, and improvement in throughput, and a reduction in production costs can be achieved.

In addition, n-channel TFTs which are strong against degradation caused by the hot carrier effect can be formed by forming an impurity region overlapping with a gate electrode through an insulating film, as explained using FIG. 13. A light emitting device having high reliability can therefore be realized.

Further, although only a pixel portion and a driver circuit are shown in this embodiment, it is also possible to form logic circuits such as a signal dividing circuit, a D/A converter, an operational amplifier, and a a correction circuit on the same insulator in accordance with the manufacturing process of this embodiment. In addition, memory circuits and microprocessors can also be formed.

FIGS. 14A and 14B are used for explaining the light emitting device of this embodiment after performing the process through a sealing (enclosing) step for protecting the light emitting elements. Note that the reference numerals used in FIG. 13 are also used in FIGS. 14A and 14B.

FIG. 14A is an upper surface diagram showing the state up through the performance of sealing the light emitting elements, and FIG. 14B is a cross sectional diagram of FIG. 14A cut along a line segment C-C'. Reference numeral 801 shown by a dotted line denotes a source side driver circuit, reference numeral 806 denotes a pixel portion, and reference numeral 807 denotes a gate side driver circuit. Further, reference numeral 901 denotes a covering material, reference numeral 902 denotes a first sealing material, and reference numeral 903 denotes a second sealing material. A sealant 907 is provided on the inside area surrounded by the first sealing material 902.

Note that reference numeral 904 denotes a wiring for transmitting signals input to the source side driver circuit 801 and the gate side driver circuit 807, and that the wiring receives video signals and clock signals from an external input terminal FPC (flexible printed circuit) 905. Although only the FPC is shown in the figures here, a printed wiring board (PWB) may also be attached to the FPC. The light emitting device in this specification includes not only the light emitting device body itself, but also the state in which an FPC or a PWB is attached to the light emitting device body.

The cross sectional structure is explained next using FIG. 14B. The pixel portion 806 and the gate side driver circuit 807 are formed on a substrate 700. The pixel portion 806 is formed by a plurality of pixels containing the current control TFT 604 and the pixel electrode 711 electrically connected to the drain of the current control TFT 604. Furthermore, the gate side driver circuit 807 is formed using a CMOS circuit in which the n-channel TFT 601 and the p-channel TFT 602 are combined (refer to FIG. 13).

The pixel electrode 711 functions as the anode of the light emitting element. Further, the banks 712 are formed in both edges of the pixel electrode 711, and the light emitting layer 713 and the cathode 714 of the light emitting element are formed on the pixel electrode 711.

The cathode 714 also functions as a common wiring to all pixels, and is electrically connected to a FPC 905 via the connection wiring 904. In addition, elements contained in the pixel portion 806 and the gate side driver circuit 807 are all covered by the cathode 714 and the passivation film 716 The covering material 901 is joined by the first sealing material 902. Note that spacers made from a resin film may also be formed in order to maintain a gap between the covering material 901 and the light emitting elements. The sealant 907 is filled into the inside of the first sealing material 902. Note that it is preferable to use an epoxy resin as the first sealing material 902 and the sealant 907. Further, it is preferable that the first sealing material 902 be a material through which as little as possible moisture and oxygen can pass. In addition, a substance possessing a hygroscopic effect and a substance possessing an oxidation preventing effect may also be included in the inside of the sealant 907.

The sealant 907 formed so as to cover the light emitting elements also functions as an adhesive for bonding the covering material 901. Further, in this embodiment, FRP (fiberglass reinforced plastic), PVF (polyvinyl fluoride), Mylar, polyester, or acrylic can be used as the material of the plastic substrate 901 that constitutes the covering material 901.

After bonding the covering material 901 using the sealant 907, the second sealing material 903 is formed so as to cover the side surfaces (exposed surfaces) of the sealant 907. The same material as for the first sealing material 902 can be used for the second sealing material 903.

The light emitting elements can be completely cut off form the outside by sealing the light emitting elements having the aforementioned structure in the sealant 907. In addition, the incursion of substances from the outside, such as moisture and oxygen, which promote deterioration due to oxidization of the light emitting layers, can be prevented,. A light emitting device having high reliability can therefore be obtained.

Note that it is possible to freely combine this embodiment with Embodiments 1 to 6.

[Embodiment 9]

Figure 15:
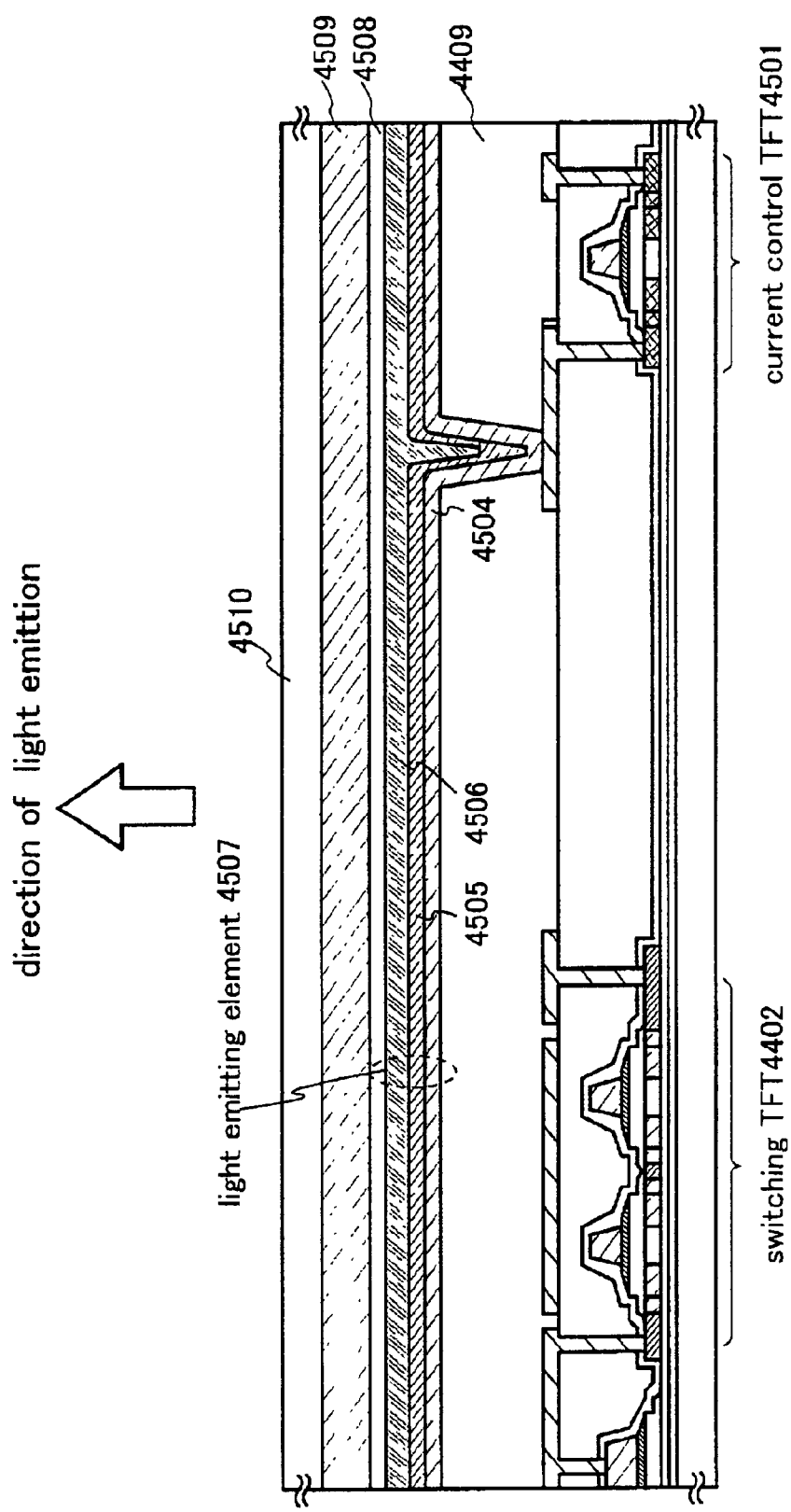
FIG. 15 is a cross sectional structure diagram of a pixel portion of a light emitting device.

A light emitting device having a pixel structure that differs from the pixel structure of embodiment 8 is explained in this embodiment. FIG. 15 is used for the explanation.

A TFT having the identical structure as that of the n-channel TFT 601 of FIG. 12 is used as a current control TFT 4501 in FIG. 15. A gate electrode of the current control TFT 4501 is of course electrically connected to a drain wiring of a switching TFT 4402. Further, a drain wiring of the current control TFT 4501 is electrically connected to a pixel electrode 4504.

The pixel electrode 4504 made from a conductive film functions as a cathode of a light emitting element in this embodiment. Specifically, an alloy film of aluminum and lithium is used, but a conductive film made from an element residing in group 1 or group 2 of the periodic table, or a conductive film added with the group 1 element or the group 2 element, may also be used.

A light emitting layer 4505 is formed on the pixel electrode 4504. Note that only one pixel is shown in FIG. 15, and that a light emitting layer corresponding to G (green) is formed by evaporation or application (preferably spin coating) in this embodiment. Specifically, a lamination structure is used in which a lithium fluoride (LiF) film having a thickness of 20 nm is formed as an electron injection layer, and a PPV (polyparaphenylene vinylene) film having a thickness of 70 nm is formed as a light emitting layer on the electron injection layer.

Next, an anode 4506 made from a transparent conductive film is formed on the light emitting layer 4505. A conductive film made from a chemical compound of indium oxide and tin oxide or from a chemical compound of indium oxide and zinc oxide is used as the transparent conductive film in this embodiment.

A light emitting element 4507 is complete at the point up through the formation of the anode 4506. Note that the light emitting element 4507 mentioned here indicates a diode formed by the pixel electrode (cathode) 4504, the light emitting layer 4505, and the anode 4506.

It is effective to provide a passivation film 4508 so as to completely cover the light emitting element 4507. The passivation film 4508 is made of an insulating film containing a carbon film, a silicon nitride film, or a silicon oxynitride film, and the insulating film is used as a single layer or as a lamination layer of a combination of layers.

In addition, a sealant 4509 is provided on the passivation film 4508, and a covering material 4510 is joined. An ultraviolet setting resin may be used as the sealant 4509, and it is effective to provide therein a substance having a hygroscopic effect or a substance having an oxidation preventing effect in the inside. Furthermore, in this embodiment, a glass substrate, a quartz substrate, or a plastic substrate (including a plastic film) in which a carbon film (preferably a diamond like carbon film) is formed on both the surfaces is used as the covering material 4510.

Note that it is possible to freely combine this embodiment with embodiments 1 to 6.

[Embodiment 10]

An example of manufacturing a liquid crystal display device using the present invention is explained in this embodiment while giving an example in which the TFT structure differs from that of the active matrix substrate manufactured in embodiments 5 and 8.

Figure 16A:
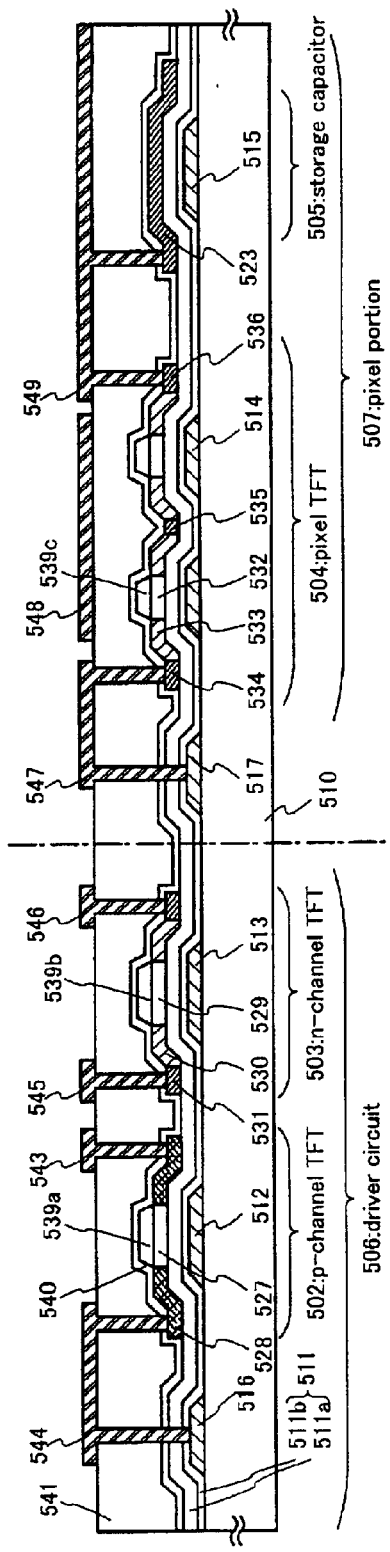
FIG. 16A is a cross sectional diagram showing a method of manufacturing an active matrix substrate.

An active matrix substrate shown in FIG. 16A is formed by the driver circuit 506 having the n-channel TFT 503 and the p-channel TFT 502, and by the pixel portion 507 having the pixel TFT 504 and the storage capacitor 505.

After forming the gate wirings 512 to 517 on the substrate 510, the insulating film 511 (511a, 511b) is formed on the gate wirings, and regions such as channel forming regions, source regions or drain regions, and LDD regions are formed on the insulating film, thereby forming these TFTs. Semiconductor films are formed as in Embodiments 1 to 6 by using the present invention.

The gate wirings 512 to 517 are formed having a thickness of 200 to 400 nm, preferably 250 nm, and the edge portions are formed so as to have a tapered shape in order to increase the step coverage of films formed on top. The angle of the tapered portion is from 5 to 30°, preferably from 15 to 25°. The tapered portion is formed by dry etching, and the angle is controlled by etching gas used and a bias voltage applied to the substrate.

Further, impurity regions are formed by the first through third doping processes. The first doping process is performed first, forming an LDD (lightly doped drain) region of the n-channel TFT. Ion doping or ion injection may be performed as the doping method. Phosphorous (P) is added as an impurity element that imparts n-type conductivity (donor), and first impurity regions 530 and 533 are formed by using a mask that covers the channel forming regions 529 and 532. The impurity element is of course also added to regions that become the source regions and drain regions 531 and 534 of the n-channel TFT. A new mask is formed covering the channel forming region and the LDD region of the n-channel TFT, and the second doping process is performed, forming the source regions and drain regions 531 and 534 of the n-channel TFT.

A source region or drain region 528 of the p-channel TFT is formed by the third doping process. An impurity element that imparts p-type conductivity (acceptor) is added by ion doping or ion injection performed as the doping method. A masks is formed on the semiconductor film forming the n-channel TFT at this point, and therefore the p-type conductivity imparting impurity element is not added to the semiconductor film. An LDD region is not formed in the p-channel TFT in this embodiment, but it may of course be manufactured.

An LDD region 530 and the source region or drain region 531 are thus formed on the outside of a channel forming region 529 in the n-channel TFT 503. The p-channel TFT 502 is given a similar structure, and is constituted of a channel forming region 527, and the source or drain region 528. Note that although a single gate structure is used in this embodiment, a double gate structure or a triple gate structure may also be used.

In the pixel portion 507, the pixel TFT 504 formed by an n-channel TFT is formed using a multi-gate structure with the aim of reducing an off current. An LDD region 533 and the source region or drain region 534 are formed on the outside of a channel forming region 532.

An interlayer insulating film is formed by a first interlayer insulating film 540, which has a thickness of 50 to 500 nm and is made from an inorganic material such as silicon oxide, silicon nitride, or silicon oxynitride, and a second interlayer insulating film 541, which is made from an organic insulating material such as polyimide, acrylic, polyimide amide, or BCB (benzocyclobutene). The surface of the interlayer insulating film can be satisfactorily made flat by forming the second interlayer insulating film made from an organic insulating material as described above. Further, organic resin materials generally have low dielectric constants, and therefore parasitic capacitance can be lowered. However, the organic resin materials have hygroscopic properties and are not suited to be used as protective films, and therefore it is preferable to combine the second interlayer insulating film 541 with the first interlayer insulating film 540. Insulating layers 539a to 539c are also formed in this embodiment with the goal of protecting the channel forming regions 527, 529, and 532.

A resist mask is formed next in a predetermined pattern, and contact holes for reaching the source regions or the drain regions formed in the respective semiconductor films are formed. Dry etching is performed in order to form the contact holes. In this case the second interlayer insulating film 541 made from an organic resin material is etched first using a mixed gas of $CF_4$, $O_2$, and He, and the first interlayer insulating film 540 is etched next after changing the etching gas to $CF_4$ and $O_2$.

A conductive metallic film is then formed by sputtering or vacuum evaporation, a resist mask pattern is formed, and wirings 543 to 549 are formed by etching. An active matrix substrate can thus be formed.

Figure 16B:
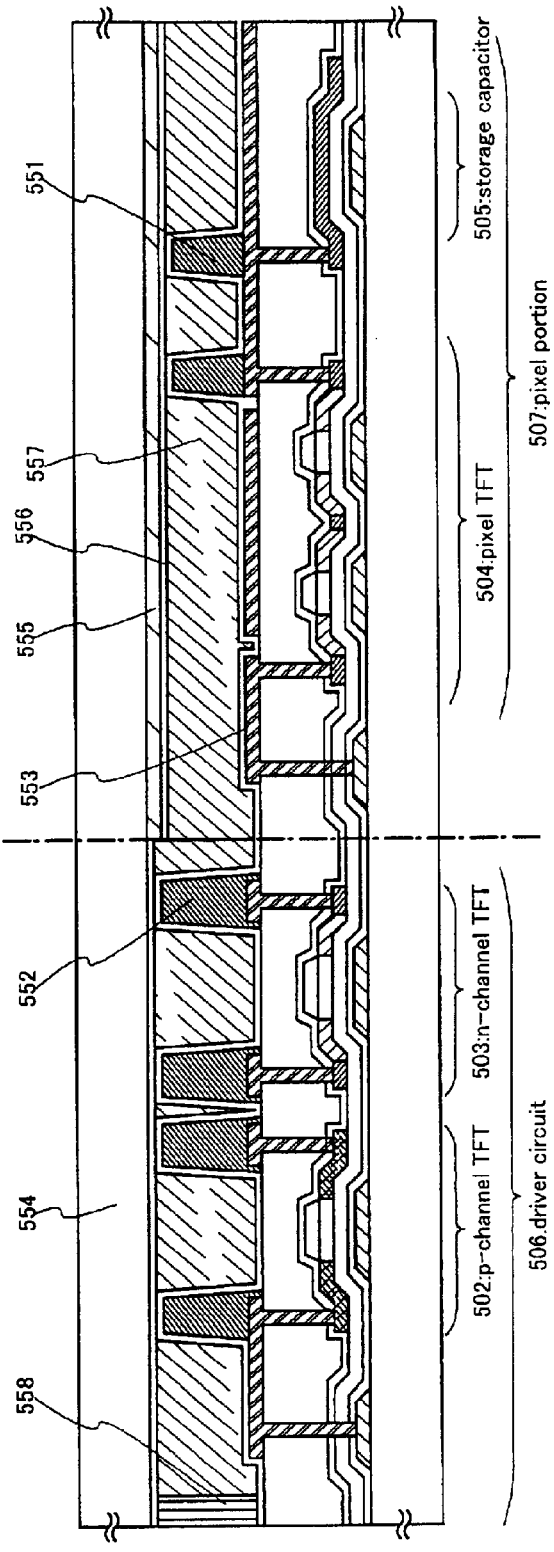
FIG. 16B is a cross sectional diagram showing a process of manufacturing an active matrix liquid crystal display device.

Processes for manufacturing an active matrix liquid crystal display device using the active matrix substrate of FIG. 16A is explained. FIG. 16B shows a state in which the active matrix substrate is joined to an opposing substrate 554 by a sealing material 558. First, column shaped spacers 551 and 552 are formed on the active matrix substrate in the state of FIG. 16A. The spacer 551 formed in the pixel portion is formed overlapping with a contact portion on the pixel electrode. Although depending upon the used liquid crystal material, the spacers are formed with a height of 3 to 10 $\mu$m. A concave portion is formed in the contact portion corresponding to a contact hole, and therefore disorder in the orientation of the liquid crystals can be prevented by forming the spacer in the concave portion. An orientation film 553 is formed next, and a rubbing process is performed. A transparent conductive film 555 and an orientation film 556 are formed on the opposing substrate 554. The active matrix substrate and the opposing substrate are then joined, and a liquid crystal material 557 is injected therebetween.

The active matrix liquid crystal display device thus manufactured can be used as a display device for all types of electronic equipment.

Note that it is possible to freely combine this embodiment with any of Embodiments 1 to 6.

[Embodiment 11]

In this embodiment, an example of forming the light emitting device using the active matrix substrate shown in FIG. 10 will be described.

Figure 17:
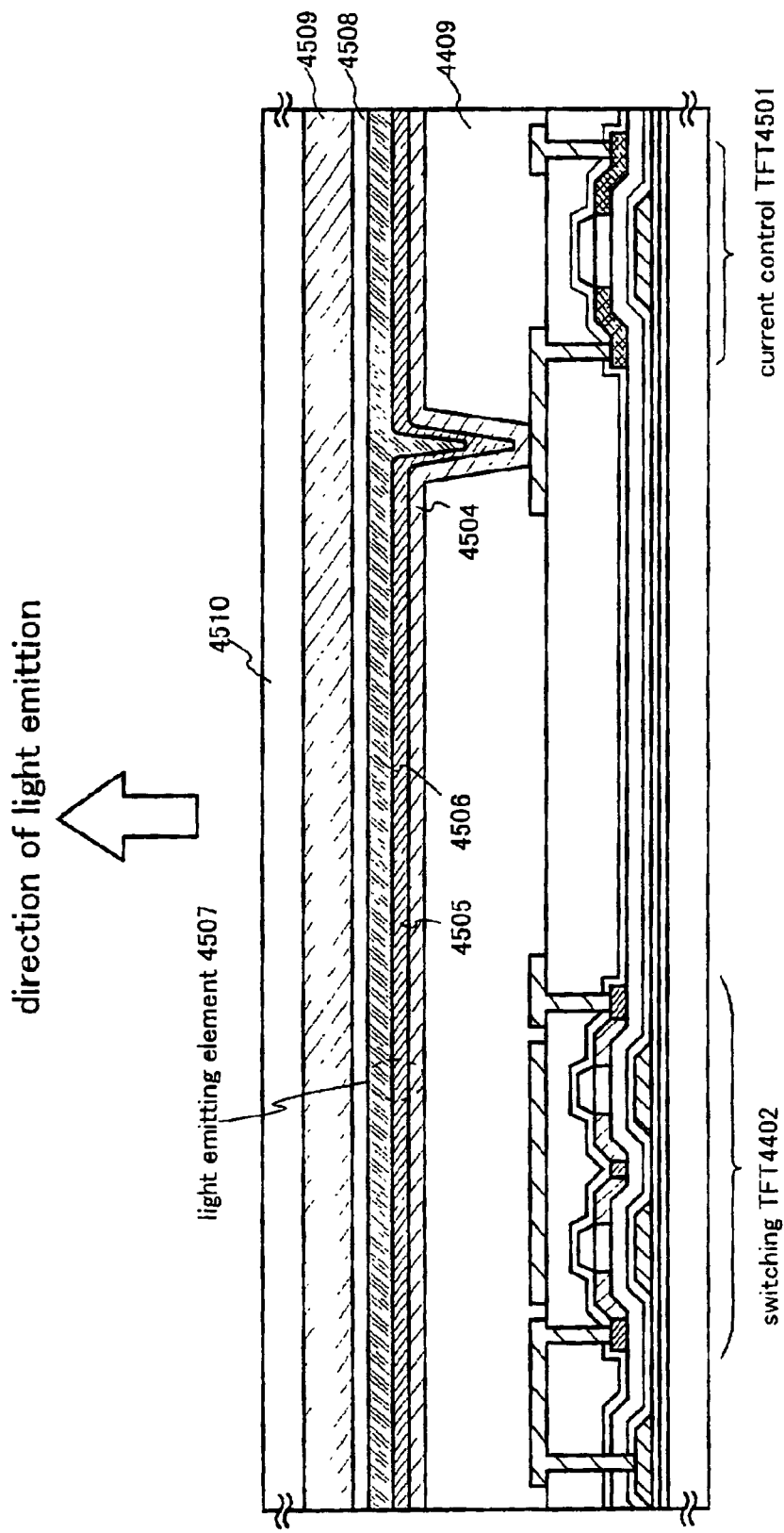
FIG. 17 is a cross sectional structure diagram of a pixel portion of a light emitting device.

In FIG. 17, a TFT having the same structure as the n-channel TFT 504 shown in FIG. 16 is used as a current control TFT 4501. Of course, the gate electrode of the current control TFT 4501 is electrically connected with a drain wiring of a switching TFT 4402. Also, the drain wiring of the current control TFT 4501 is electrically connected with a pixel electrode 4504.

In this embodiment, the pixel electrode 4504 made from a conductive film serves as the cathode of the light emitting element. Concretely, an alloy film of aluminum and lithium is used. A conductive film made of an element belonging to the group 1 or the group 2 of the periodic table or a conductive film to which the element is added is preferably used.

A light emitting layer 4505 is formed on the pixel electrode 4504. Note that, although only one pixel is shown in FIG. 17, a light emitting layer corresponding to G (green) is formed by an evaporation method and a coating method (preferably, a spin coating method) in this embodiment. Concretely, a laminate structure is used such that a lithium fluoride (LiF) film having a thickness of 20 nm is provided as an electron injection layer and a PPV (polyparaphenylenevinylene) film having a thickness of 70 nm is provided thereon as the light emitting layer.

Then, an anode 4506 made from a transparent conductive film is provided on the light emitting layer 4505. In the case of this embodiment, a conductive film made of a compound of indium oxide and tin oxide or a compound of indium oxide and zinc oxide is used as the transparent conductive film.

When the anode 4506 is formed, a light emitting element 4507 is completed. Note that the light emitting element 4507 described here indicates a diode composed of the pixel electrode (cathode) 4504, the light emitting layer 4505, and the anode 4506.

It is effective to provide a passivation film 4508 so as to completely cover the light emitting element 4507. The passivation film 4508 is made from an insulating film including a carbon film, a silicon nitride film, or a silicon oxynitride film and used as a single layer of the insulating film or a laminate as a combination thereof.

Further, a sealant 4509 is provided on the passivation film 4508 and a covering material 4510 is bonded thereto. An ultraviolet curable resin is preferably used as the sealant 4509 and it is effective to provide a material having a moisture absorption effect or a material having an antioxidant effect in the inner portion. In this embodiment, a glass substrate, a quartz substrate, or a plastic substrate (including a plastic film), in which a carbon film (preferably, a diamond-like carbon film) is formed on both surfaces is used as the covering material 4510.

Note that this embodiment can be freely combined with Embodiments 1 to 6.

[Embodiment 12]

The CMOS circuit and the pixel portion formed by implementing the invention can be used in various electro-optical devices (active matrix type liquid crystal display device, active matrix type EC display device, active matrix type EL display, active matrix type light emitting display device). That is, the present invention can be implemented in all of electronic apparatuses integrated with the electro-optical devices at display portions thereof.

As such electronic apparatus, there are pointed out a video camera, a digital camera, a projector, a head mount display (goggle type display), a car navigation system, a car stereo, a personal computer, a portable information terminal (mobile computer, portable telephone or electronic book) and the like. Examples of these are shown in FIGS. 18A through 18F, FIGS. 19A through 19D and FIGS. 20A through 20C.

Figure 18A:
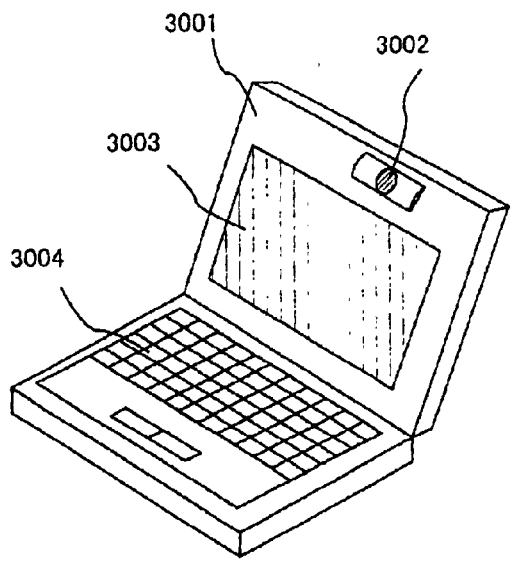
FIGS. 18A to 18F are diagrams showing examples of semiconductor devices.

FIG. 18A shows a personal computer including a main body 3001, an image input portion 3002, a display portion 3003 and a keyboard 3004. The invention is applicable to the display portion 3003.

Figure 18B:
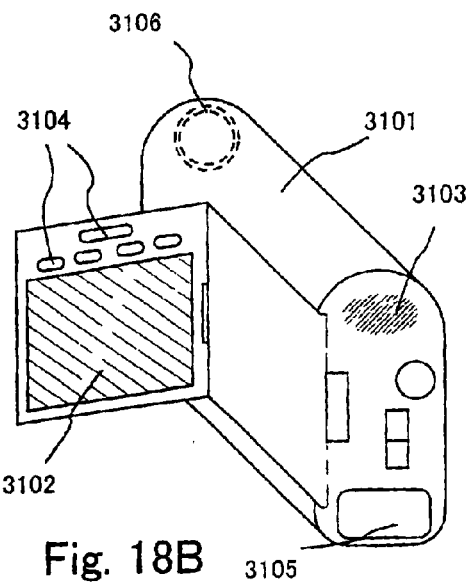

FIG. 18B shows a video camera including a main body 3101, a display portion 3102, a voice input portion 3103, operation switches 3104, a battery 3105 and an image receiving portion 3106. The invention is applicable to the display portion 3102.

Figure 18C:
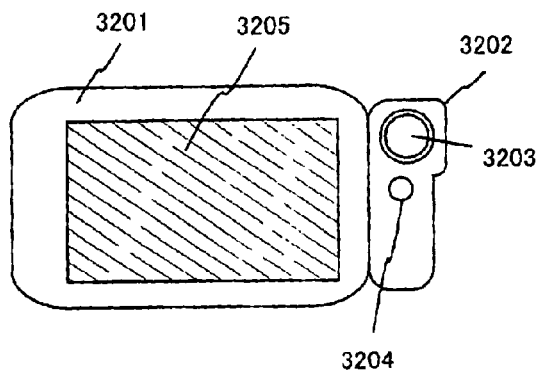

FIG. 18C shows a mobile computer including a main body 3201, a camera portion 3202, an image receiving portion 3203, an operation switch 3204 and a display portion 3205. The invention is applicable to the display portion 3205.

Figure 18D:
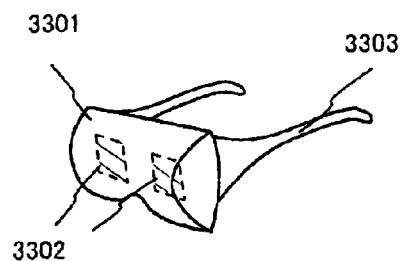

FIG. 18D shows a goggle type display including a main body 3301, a display portion 3302 and an arm portion 3303. The invention is applicable to the display portion 3302.

Figure 18E:
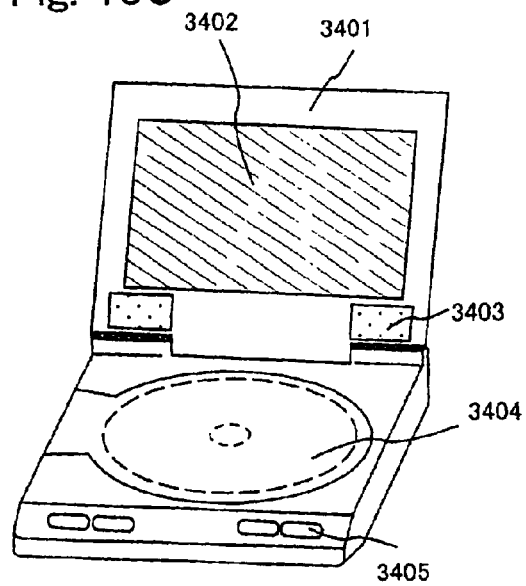

FIG. 18E shows a player using a record medium recorded with programs (hereinafter, referred to as record medium) including a main body 3401, a display portion 3402, a speaker portion 3403, a record medium 3404 and an operation switch 3405. The player uses DVD (Digital Versatile Disc) or CD as the record medium and can enjoy music, enjoy movie and carry out game or Internet. The invention is applicable to the display portion 3402.

Figure 18F:
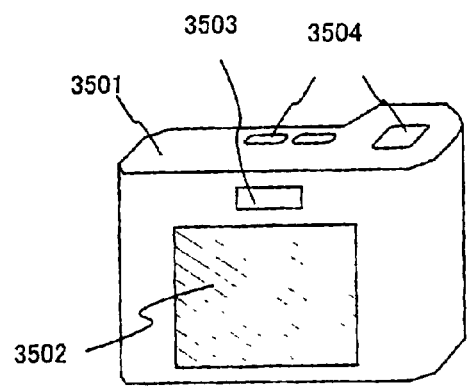

FIG. 18F shows a digital camera including a main body 3501, a display portion 3502, an eye contact portion 3503, operation switches 3504 and an image receiving portion (not illustrated). The invention is applicable to the display portion 3502.

Figure 19A:
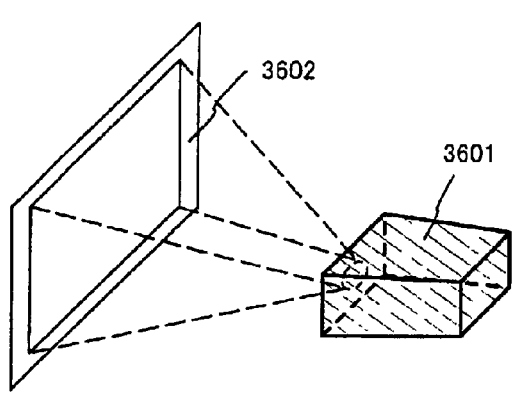
FIGS. 19A to 19D are diagrams showing examples of semiconductor devices.

FIG. 19A shows a front type projector including a projection apparatus 3601 and a screen 3602. The invention is applicable to a liquid crystal display apparatus 3808 constituting a portion of the projection apparatus 3601 and other driver circuit.

Figure 19B:
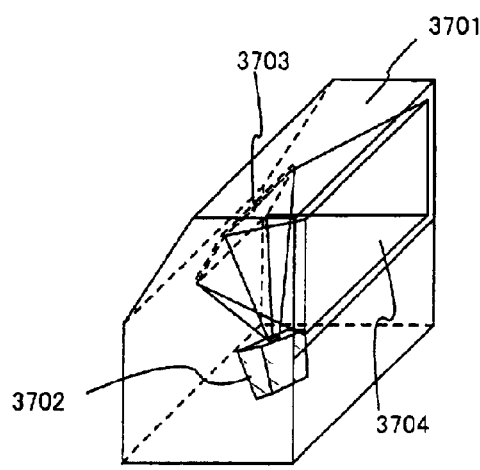

FIG. 19B shows a rear type projector including a main body 3701, a projection apparatus 3702, a mirror 3703 and a screen 3704. The invention is applicable to a liquid crystal display apparatus 3808 constituting a portion of the projection apparatus 3702 and other driver circuit.

Figure 19C:
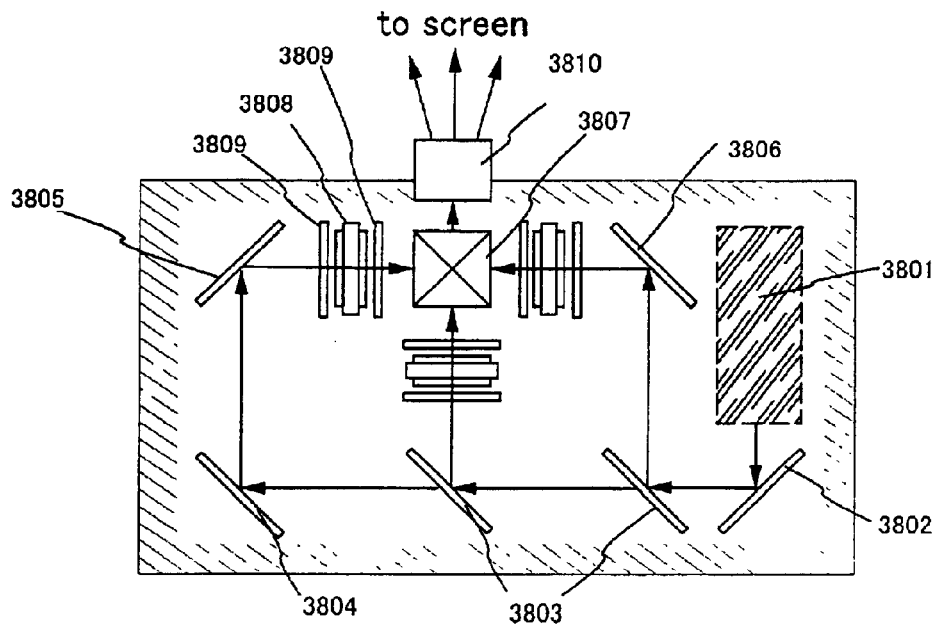

Further, FIG. 19C is a view showing an example of a structure of the projection apparatus 3601 and 3702 in FIG. 19A and FIG. 19B, respectively. The projection apparatus 3601 or 3702 is constituted by a light source optical system 3801, mirrors 3802, and 3804 through 3806, a dichroic mirror 3803, a prism 3807, a liquid crystal display apparatus 3808, a phase difference plate 3809 and a projection optical system 3810. The projection optical system 3810 is constituted by an optical system including a projection lens. Although the embodiment shows an example of three plates type, the embodiment is not particularly limited thereto but may be of, for example, a single plate type. Further, a person of executing the embodiment may pertinently provide an optical system such as an optical lens, a film having a polarization function, a film for adjusting a phase difference or an IR film in an optical path shown by arrow marks in FIG. 19C.

Figure 19D:
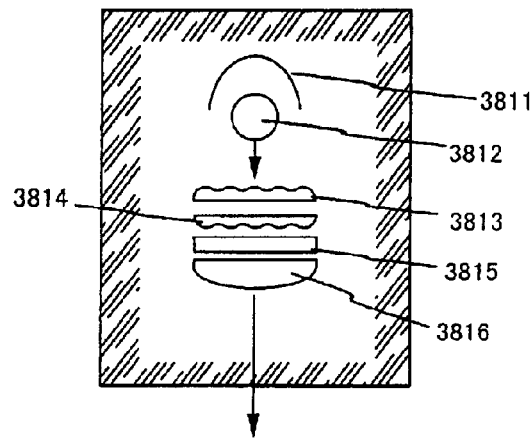

Further, FIG. 19D is a view showing an example of a structure of the light source optical system 3801 in FIG. 19C. According to the embodiment, the light source optical system 3801 is constituted by a reflector 3811, a light source 3812, lens arrays 3813 and 3814, a polarization conversion element 3815 and a focusing lens 3816. Further, the light source optical system shown in FIG. 19D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 19A, 19B and 19C, there is shown a case of using a transmission type electronic apparatus and an example of applying a reflection type electronic apparatus is not illustrated.

Figure 20A:
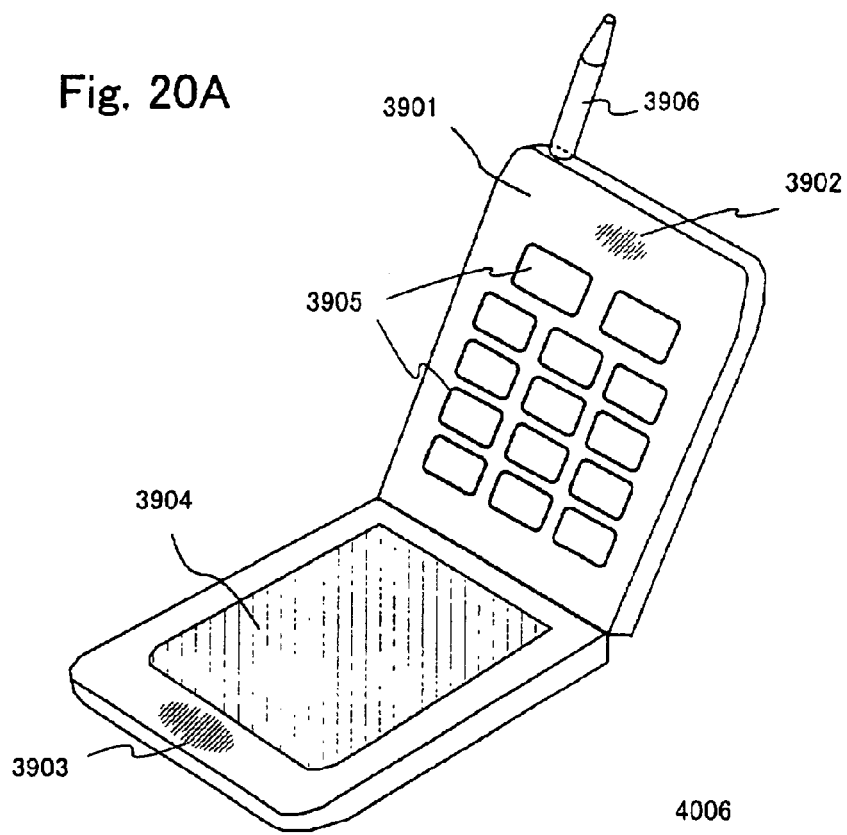
FIGS. 20A to 20C are diagrams showing examples of semiconductor devices.

FIG. 20A shows a portable telephone including a main body 3901, a voice output portion 3902, a voice input portion 3903, a display portion 3904, an operation switch 3905 and an antenna 3906. The invention is applicable to the display portion 3904.

Figure 20B:
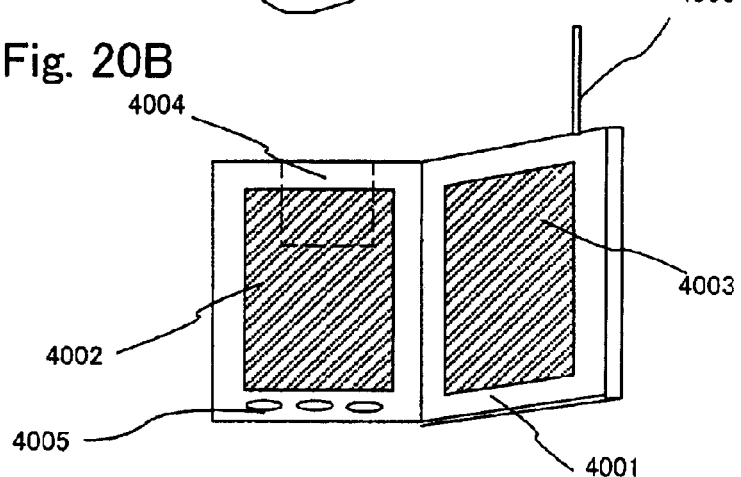

FIG. 20B shows a portable book (electronic book) including a main body 4001, display portions 4002 and 4003, a record medium 4004, an operation switch 4005 and an antenna 4006. The invention is applicable to the display portions 4002 and 4003.

Figure 20C:
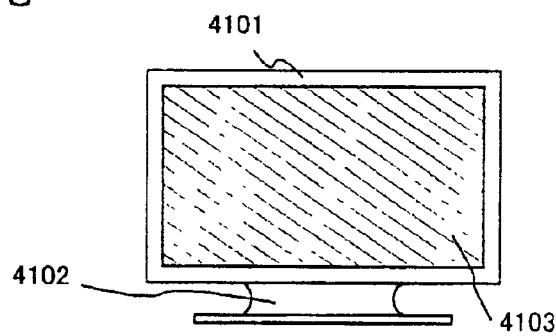

FIG. 20C shows a display including a main body 4101, a support base 4102 and a display portion 4103. The invention is applicable to the display portion 4103. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. Further, the electronic apparatus of the embodiment can be realized by using any constitution comprising any combinations of Embodiments 1 to 9.

The fundamental significance shown below can be obtained by employing the structure of the present invention:

a) A simple structure conforming to a conventional TFT manufacturing process;

b) The film qualities of a gate insulating film formed on a semiconductor film can be made sufficient and levelness thereof can be maintained. In addition, it becomes possible to form TFTs having a high mobility;

c) While satisfying the above advantages, an increase in the operational properties and in its reliability can be achieved in a semiconductor device typified by a high definition active matrix liquid crystal display device.

What is claimed is:

1. A method of manufacturing a semiconductor device comprising the steps of:

forming a crystalline semiconductor film by irradiating a laser light to an amorphous semiconductor film; and irradiating a lamp light to the crystalline semiconductor film to reduce distortion formed in the crystalline semiconductor film wherein the distortion is caused by the irradiation of the laser light, wherein a temperature rising rate and a temperature lowering rate for the lamp light irradiation are within a range of +/− 30 to 300° C./minute.

2. A method of manufacturing a semiconductor device according to claim 1, wherein the laser light is emitted from one or a plurality of types selected from the group consisting of a gas laser, a solid state laser, and a metal laser, each laser being continuous light emission or pulse light emission type.

3. A method of manufacturing a semiconductor device according to claim 2, wherein the solid state laser is a laser selected from the group consisting of a YAG laser, a $YVO_4$ laser, a YLF laser, a $YAlO_3$ laser, a glass laser, a ruby laser, an alexandrite laser, and a Ti:sapphire laser.

4. A method of manufacturing a semiconductor device according to claim 1, wherein the amount of time for the lamp light irradiation is within a range of 1 to 30 minutes.

5. A method of manufacturing a semiconductor device according to claim 1, wherein a temperature for the lamp light irradiation is equal to or greater than 500° C.

6. A method of manufacturing a semiconductor device according to claim 1, wherein the lamp light is irradiated from the upper side of a substrate, from the lower side of the substrate, or from both the upper and the lower sides of the substrate.

7. A method of manufacturing a semiconductor device according to claim 1, wherein the lamp light is light emitted from one lamp selected from the group consisting of a halogen lamp, a metal halide lamp, a xenon arc lamp, a carbon arc lamp, a high pressure sodium lamp, and a high pressure mercury lamp.

8. A method of manufacturing a semiconductor device comprising the steps of:

forming a first crystalline semiconductor film by irradiating a lamp light to an amorphous semiconductor film;

forming a second crystalline semiconductor film by irradiating a laser light to the first crystalline semiconductor film; and performing a heat treatment to the second crystalline semiconductor film to reduce distortion formed in the second crystalline semiconductor film wherein the distortion is caused by the irradiation of the laser light.

9. A method of manufacturing a semiconductor device according to claim 8, wherein the laser light is emitted from one or a plurality of types selected from the group consisting of a gas laser, a solid state laser, and a metal laser, each laser being continuous light emission or pulse light emission type.

10. A method of manufacturing a semiconductor device according to claim 9, wherein the solid state laser is a laser selected from the group consisting of a YAG laser, a $YVO_4$ laser, a YLF laser, a $YAlO_3$ laser, a glass laser, a ruby laser, an alexandrite laser, and a Ti:sapphire laser.

11. A method of manufacturing a semiconductor device according to claim 8, wherein heating time for the heat treatment is within a range of 1 to 30 minutes.

12. A method of manufacturing a semiconductor device according to claim 8, wherein a heating temperature of the heat treatment is equal to or greater than 500° C.

13. A method of manufacturing a semiconductor device comprising the steps of:

forming an amorphous semiconductor film on an insulating surface;

forming a first crystalline semiconductor film by irradiating a lamp light to the amorphous semiconductor film;

forming a second crystalline semiconductor film by irradiating a laser light to the first crystalline semiconductor film;

forming an island shape second crystalline semiconductor film by etching the second crystalline semiconductor film; and performing a heat treatment to the island shape second crystalline semiconductor film to reduce distortion formed in the island shape second crystalline semiconductor film wherein the distortion is caused by the irradiation of the laser light.

14. A method of manufacturing a semiconductor device according to claim 13, wherein the step of forming the island shape second crystalline semiconductor film is performed after the step of performing the heat treatment.

15. A method of manufacturing a semiconductor device comprising the steps of:

forming a first crystalline semiconductor film by performing a first heat treatment to an amorphous semiconductor film;

forming a second crystalline semiconductor film by irradiating a laser light to the first crystalline semiconductor film; and performing a second heat treatment to the second crystalline semiconductor film to reduce distortion formed in the second crystalline semiconductor film wherein the distortion is caused by the irradiation of the laser light.

16. A method of manufacturing a semiconductor device according to claim 15, wherein the laser light is emitted from one or a plurality of types selected from the group consisting of a gas laser, a solid state laser, and a metal laser, each laser being continuous light emission or pulse light emission type.

17. A method of manufacturing a semiconductor device according to claim 16, wherein the solid state laser is a laser selected from the group consisting of a YAG laser, a $YVO_4$ laser, a YLF laser, a $YAlO_3$ laser, a glass laser, a ruby laser, an alexandrite laser, and a Ti:sapphire laser.

18. A method of manufacturing a semiconductor device according to claim 15, wherein heating time for the second heat treatment is within a range of 1 to 30 minutes.

19. A method of manufacturing a semiconductor device according to claim 15, wherein a heating temperature of the first heat treatment is equal to or greater than 600° C.

20. A method of manufacturing a semiconductor device according to claim 15, wherein a heating temperature of the second heat treatment is equal to or greater than 500° C.

21. A method of manufacturing a semiconductor device comprising the steps of:
    forming an amorphous semiconductor film on an insulating surface;
    forming a first crystalline semiconductor film by performing a first heat treatment to the amorphous semiconductor film;
    forming a second crystalline semiconductor film by irradiating a laser light to the first crystalline semiconductor film;
    forming an island shape second crystalline semiconductor film by etching the second crystalline semiconductor film; and
    performing a second heat treatment to the island shape second crystalline semiconductor film to reduce distortion formed in the island shape second crystalline semiconductor film wherein the distortion is caused by the irradiation of the laser light.

22. A method of manufacturing a semiconductor device according to claim 21, wherein the step of forming the island shape second crystalline semiconductor film is performed after the step of performing the second heat treatment.

23. A method of manufacturing a semiconductor device comprising the steps of:
    forming a first crystalline semiconductor film by performing a heat treatment to an amorphous semiconductor film;
    forming a second crystalline semiconductor film by irradiating a laser light to the first crystalline semiconductor film; and
    irradiating a lamp light to the second crystalline semiconductor film to reduce distortion formed in the second crystalline semiconductor film wherein the distortion is caused by the irradiation of the laser light.

24. A method of manufacturing a semiconductor device according to claim 23, wherein the heat treatment is performed by irradiating a lamp light.

25. A method of manufacturing a semiconductor device according to claim 23, wherein the laser light is emitted from one or a plurality of types selected from the group consisting of a gas laser, a solid state laser, and a metal laser, each laser being continuous light emission or pulse light emission type.

26. A method of manufacturing a semiconductor device according to claim 25, wherein the solid state laser is a laser selected from the group consisting of a YAG laser, a $YVO_4$ laser, a YLF laser, a $YAlO_3$ laser, a glass laser, a ruby laser, an alexandrite laser, and a Ti:sapphire laser.

27. A method of manufacturing a semiconductor device according to claim 23, wherein the amount of time for the lamp light irradiation is within a range of 1 to 30 minutes.

28. A method of manufacturing a semiconductor device according to claim 23, wherein a temperature for the lamp light irradiation is equal to or greater than 500° C.

29. A method of manufacturing a semiconductor device according to claim 23, wherein a temperature rising rate and a temperature lowering rate for the lamp light irradiation are within a range of +/− 30 to 300° C./minute.

30. A method of manufacturing a semiconductor device according to claim 23, wherein the lamp light is irradiated from the upper side of a substrate, from the lower side of the substrate, or from both the upper and the lower sides of the substrate.

31. A method of manufacturing a semiconductor device according to claim 23, wherein the lamp light is light emitted from one lamp selected from the group consisting of a halogen lamp, a metal halide lamp, a xenon arc lamp, a carbon arc lamp, a high pressure sodium lamp, and a high pressure mercury lamp.

32. A method of manufacturing a semiconductor device according to claim 23, wherein a heating temperature of the heat treatment is equal to or greater than 600° C.

33. A method of manufacturing a semiconductor device comprising the steps of:
    forming an amorphous semiconductor film on an insulating surface;
    forming a first crystalline semiconductor film by performing a heat treatment to the amorphous semiconductor film;
    forming a second crystalline semiconductor film by irradiating a laser light to the first crystalline semiconductor film;
    forming an island shape second crystalline semiconductor film by etching the second crystalline semiconductor film; and
    irradiating a lamp light to the island shape second crystalline semiconductor film to reduce distortion formed in the island shape second crystalline semiconductor film wherein
the distortion is caused by the irradiation of the laser light.

34. A method of manufacturing a semiconductor device according to claim 33, wherein the step of forming the island shape second crystalline semiconductor film is performed after the step of irradiating the lamp light.

35. A method of manufacturing a semiconductor device according to claim 33, wherein the heat treatment is performed by irradiating a lamp light.

* * * * *